United States Patent
Kim

(10) Patent No.: US 12,207,500 B2
(45) Date of Patent: Jan. 21, 2025

(54) ORGANIC LIGHT-EMITTING DISPLAY APPARATUS

(71) Applicant: SAMSUNG DISPLAY CO., LTD., Yongin-si (KR)

(72) Inventor: Jiyoon Kim, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 203 days.

(21) Appl. No.: 17/137,926

(22) Filed: Dec. 30, 2020

(65) Prior Publication Data
US 2021/0376019 A1    Dec. 2, 2021

(30) Foreign Application Priority Data

May 28, 2020    (KR) .................. 10-2020-0064610

(51) Int. Cl.
| | | |
|---|---|---|
| H10K 59/122 | (2023.01) | |
| H10K 50/844 | (2023.01) | |
| H10K 59/121 | (2023.01) | |

(52) U.S. Cl.
CPC ......... *H10K 59/122* (2023.02); *H10K 50/844* (2023.02); *H10K 59/121* (2023.02)

(58) Field of Classification Search
CPC ............... H01L 27/3246; H01L 27/326; H01L 51/5253; H10K 59/122; H10K 59/121; H10K 50/844
See application file for complete search history.

(56) References Cited

U.S. PATENT DOCUMENTS

| | | | |
|---|---|---|---|
| 9,171,865 | B2 | 10/2015 | Seo et al. |
| 9,748,318 | B2 | 8/2017 | Shim et al. |
| 2016/0064673 | A1 | 3/2016 | Park et al. |
| 2016/0372534 | A1 | 12/2016 | Lee |
| 2018/0047799 | A1 | 2/2018 | Lim et al. |

(Continued)

FOREIGN PATENT DOCUMENTS

| | | |
|---|---|---|
| EP | 3343617 A1 | 7/2018 |
| KR | 1020140079093 A | 6/2014 |

(Continued)

OTHER PUBLICATIONS

Extended European Search Report for Application No. 21175117.7 dated Sep. 29, 2021, citing the above reference(s).

*Primary Examiner* — Shaun M Campbell
(74) *Attorney, Agent, or Firm* — CANTOR COLBURN LLP

(57) ABSTRACT

An organic light-emitting display apparatus includes: a semiconductor layer including a drain region; an interlayer-insulating layer covering the semiconductor layer; a connection metal on the interlayer-insulating layer and contacting the drain region through an interlayer contact hole in the interlayer-insulating layer; a protective insulating layer covering the connection metal; a bridge electrode on the protective insulating layer and contacting the connection metal through a protective contact hole in the protective insulating layer; a planarization layer covering the bridge electrode; and a pixel electrode on the planarization layer and connected to the bridge electrode through a pixel contact hole in the planarization layer. In a plan view, the pixel contact hole is defined outside the protective contact hole.

17 Claims, 13 Drawing Sheets

(56) References Cited

U.S. PATENT DOCUMENTS

| | | | | |
|---|---|---|---|---|
| 2018/0159065 A1* | 6/2018 | Kim | ................... | H01L 27/3276 |
| 2018/0254304 A1* | 9/2018 | Hong | ................... | H01L 27/3279 |
| 2019/0189720 A1 | 6/2019 | Lim et al. | | |
| 2019/0206974 A1 | 7/2019 | Park et al. | | |
| 2021/0351248 A1* | 11/2021 | Lee | ................... | H01L 27/3246 |
| 2022/0005994 A1* | 1/2022 | Morita | ................ | G09G 3/3233 |
| 2022/0028938 A1* | 1/2022 | Zhao | ................... | H01L 27/3276 |
| 2022/0037428 A1* | 2/2022 | Lou | ................... | H01L 51/5234 |
| 2022/0123094 A1* | 4/2022 | Qiu | ................... | H01L 27/326 |
| 2022/0199734 A1* | 6/2022 | Ko | ................... | H01L 27/3276 |
| 2022/0320214 A1* | 10/2022 | Qu | ................... | H01L 27/3272 |

FOREIGN PATENT DOCUMENTS

| | | | |
|---|---|---|---|
| KR | 1020160119301 A | 10/2016 | |
| KR | 1020170122360 A | 11/2017 | |
| KR | 1020190073848 A | 6/2019 | |
| KR | 102075529 B1 | 2/2020 | |
| WO | 2007119321 A2 | 10/2007 | |

\* cited by examiner

ORGANIC LIGHT-EMITTING DISPLAY APPARATUS

This application claims priority to Korean Patent Application No. 10-2020-0064610, filed on May 28, 2020, and all the benefits accruing therefrom under 35 U.S.C. § 119, the content of which in its entirety is herein incorporated by reference.

BACKGROUND

1. Field

One or more embodiments relate to an organic light-emitting display apparatus, and more particularly, to an organic light-emitting display apparatus in which a sufficient aperture ratio may be secured.

2. Description of Related Art

Generally, a display apparatus includes a plurality of pixels, and each of the plurality of pixels includes a display element and a pixel circuit configured to control the display element. The pixel circuit includes a thin-film transistor ("TFT"), a storage capacitor, and wirings.

The brightness of a relevant pixel may vary according to the size of an opening of a pixel-defining layer covering a pixel electrode of each of the plurality of pixels.

SUMMARY

However, in an organic light-emitting display apparatus according to the related art, an aperture ratio is low. Here, the aperture ratio is a ratio of the area of an opening of a pixel-defining layer to the area of a pixel.

One or more embodiments include an organic light-emitting display apparatus in which a sufficient aperture ratio may be secured. However, it should be understood that embodiments described herein should be considered in a descriptive sense only and not for limitation of the disclosure.

Additional aspects will be set forth in part in the description which follows and, in part, will be apparent from the description, or may be learned by practice of the presented embodiments of the disclosure.

According to one or more embodiments, an organic light-emitting display apparatus includes a substrate including a first region, a first pixel semiconductor layer disposed on the substrate and including a first pixel drain region in the first region, an interlayer-insulating layer covering the first pixel semiconductor layer, a first pixel connection metal disposed on the interlayer-insulating layer and contacting the first pixel drain region through a first pixel interlayer contact hole defined in the interlayer-insulating layer, a protective insulating layer covering the first pixel connection metal, a first pixel bridge electrode disposed on the protective insulating layer and contacting the first pixel connection metal through a first pixel protective contact hole defined in the protective insulating layer, a planarization layer covering the first pixel bridge electrode, and a first pixel electrode disposed on the planarization layer and connected to the first pixel bridge electrode through a first pixel contact hole defined in the planarization layer. When viewed in a direction perpendicular to the substrate, the first pixel contact hole is defined outside the first pixel protective contact hole.

When viewed in a direction perpendicular to the substrate, the first pixel contact hole may be defined outside the first pixel connection metal.

The protective insulating layer may include an inorganic material.

The substrate may include a second region, and the organic light-emitting display apparatus may further include a second pixel semiconductor layer disposed on the substrate and including a second pixel drain region in the second region; a second pixel connection metal disposed on the interlayer-insulating layer and contacting the second pixel drain region through a second pixel interlayer contact hole defined in the interlayer-insulating layer, where the interlayer-insulating layer may cover the second pixel semiconductor layer; a second pixel bridge electrode disposed on the protective insulating layer and contacting the second pixel connection metal through a second pixel protective contact hole defined in the protective insulating layer, where the protective insulating layer may cover the second pixel connection metal; and a second pixel electrode disposed on the planarization layer covering the second pixel bridge electrode and connected to the second pixel bridge electrode through a second pixel contact hole defined in the planarization layer. Here, when viewed in the direction perpendicular to the substrate, the second pixel contact hole may be defined outside the second pixel protective contact hole.

When viewed in the direction perpendicular to the substrate, the second pixel contact hole may be defined outside the second pixel connection metal.

The second pixel contact hole may be defined in the first region.

An area of the second pixel electrode may be greater than an area of the first pixel electrode.

The substrate may include a third region, and the organic light-emitting display apparatus may further include a third pixel semiconductor layer disposed on the substrate and including a third pixel drain region in the third region; a third pixel connection metal disposed on the interlayer-insulating layer and contacting the third pixel drain region through a third pixel interlayer contact hole defined in the interlayer-insulating layer, where the interlayer-insulating layer may cover the third pixel semiconductor layer; a third pixel bridge electrode disposed on the protective insulating layer and contacting the third pixel connection metal through a third pixel protective contact hole defined in the protective insulating layer, where the protective insulating layer may cover the third pixel connection metal; and a third pixel electrode disposed on the planarization layer and connected to the third pixel bridge electrode through a third pixel contact hole defined in the planarization layer, where the planarization layer may cover the third pixel bridge electrode. Here, when viewed in the direction perpendicular to the substrate, the third pixel contact hole may be defined outside the third pixel protective contact hole.

When viewed in the direction perpendicular to the substrate, the third pixel contact hole may be defined outside the third pixel connection metal.

The second pixel contact hole and the third pixel contact hole may be defined in the first region.

The second pixel contact hole may be defined in the first region, and the third pixel contact hole may be defined in the second region.

An area of the second pixel electrode may be greater than an area of the first pixel electrode, and an area of the third pixel electrode may be greater than the area of the second pixel electrode.

According to one or more embodiments, an organic light-emitting display apparatus includes a substrate including a first region and a second region, a first pixel semiconductor layer disposed on the substrate and including a first pixel drain region in the first region, a second pixel semiconductor layer disposed on the substrate and including a second pixel drain region in the second region, an interlayer-insulating layer covering the first pixel semiconductor layer and the second pixel semiconductor layer, a first pixel connection metal disposed on the interlayer-insulating layer and contacting the first pixel drain region through a first pixel interlayer contact hole defined in the interlayer-insulating layer, a second pixel connection metal disposed on the interlayer-insulating layer and contacting the second pixel drain region through a second pixel interlayer contact hole defined in the interlayer-insulating layer, a protective insulating layer covering the first pixel connection metal and the second pixel connection metal, a second pixel bridge electrode disposed on the protective insulating layer and contacting the second pixel connection metal through a second pixel protective contact hole defined in the protective insulating layer, a planarization layer covering the second pixel bridge electrode, a first pixel electrode disposed on the planarization layer and contacting the first pixel connection metal through a first pixel contact hole defined in the planarization layer and a first pixel protective contact hole defined in the protective insulating layer, and a second pixel electrode disposed on the planarization layer and contacting the second pixel bridge electrode through a second pixel contact hole defined in the planarization layer.

When viewed in a direction perpendicular to the substrate, the second pixel contact hole may be defined outside the second pixel connection metal.

The second pixel contact hole may be disposed in the first region.

An area of the second pixel electrode may be greater than an area of the first pixel electrode.

The substrate may include a third region, and the organic light-emitting display apparatus may further include a third pixel semiconductor layer disposed on the substrate and including a third pixel drain region in the third region; a third pixel connection metal disposed on the interlayer-insulating layer and contacting the third pixel drain region through a third pixel interlayer contact hole defined in the interlayer-insulating layer, where the interlayer-insulating layer may cover the third pixel semiconductor layer a third pixel bridge electrode disposed on the protective insulating layer and contacting the third pixel connection metal through a third pixel protective contact hole defined in the protective insulating layer, where the protective insulating layer may cover the third pixel connection metal; and a third pixel electrode disposed on the planarization layer and connected to the third pixel bridge electrode through a third pixel contact hole defined in the planarization layer, where the planarization layer may cover the third pixel bridge electrode.

When viewed in a direction perpendicular to the substrate, the third pixel contact hole may be defined outside the third pixel protective contact hole.

When viewed in a direction perpendicular to the substrate, the third pixel contact hole may be defined outside the third pixel connection metal.

The second pixel contact hole and the third pixel contact hole may be defined in the first region.

The second pixel contact hole may be defined in the first region, and the third pixel contact hole may be defined in the second region.

An area of the second pixel electrode may be greater than an area of the first pixel electrode, and an area of the third pixel electrode may be greater than the area of the second pixel electrode.

These and/or other aspects will become apparent and more readily appreciated from the following description of the embodiments, the accompanying drawings, and claims.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
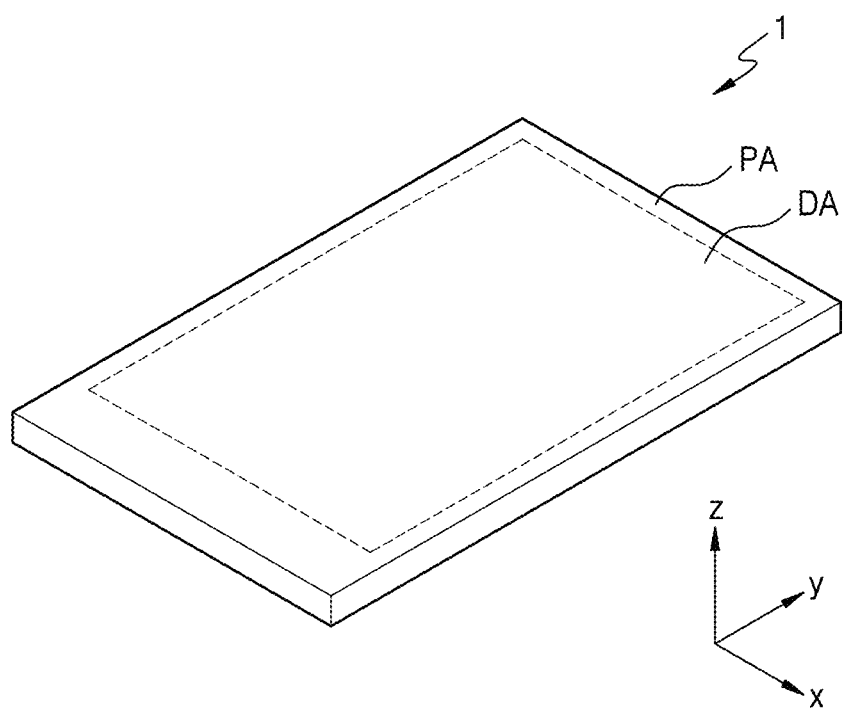
FIG. 1 is a conceptual view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. The terminology used herein is for the purpose of describing particular embodiments only and is not intended to be limiting. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof. As used herein, the singular forms "a," "an," and "the" are intended to include the plural forms, including "at least one," unless the content clearly indicates otherwise. "Or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

As the present disclosure allows for various changes and numerous embodiments, exemplary embodiments will be illustrated in the drawings and described in detail in the written description. Effects and characteristics of the present disclosure, and a method of accomplishing the same will become apparent and more readily appreciated from the following description of the embodiments and the accompanying drawings. However, the present disclosure is not limited to embodiments below and may be implemented in various forms.

Hereinafter, embodiments are described in detail with reference to the accompany drawings. When description is made with reference to the drawings, like reference numerals are given to like or corresponding elements, and repeated descriptions thereof are omitted. It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will be understood that when a layer, region, or component is referred to as being "formed on" or "disposed on" another layer, region, or component, it can be directly or indirectly formed or disposed on the other layer, region, or component. That is, for example, intervening layers, regions, or components may be present. Sizes of elements in the drawings may be exaggerated or reduced for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a conceptual view of a display apparatus 1 according to an embodiment.

The display apparatus 1 according to the present embodiment may include an electronic apparatus such as a smartphone, a mobile phone, a navigation apparatus, a game console, a television ("TV"), a head unit for an automobile, a notebook computer, a laptop computer, a tablet computer, a personal multimedia player ("PMP"), and a personal digital assistant ("FDA"). In addition, the electronic apparatus may include a flexible apparatus.

As shown in FIG. 1, the display apparatus 1 may include a display area DA and a peripheral area PA. The display apparatus 1 may include a substrate 101 (see FIG. 5). The shape of the substrate 101 according to the invention is not limited to a rectangular shape (in an xy-plane) as shown in FIG. 1 and may include various shapes such as a circular shape in another embodiment. In addition, the substrate 101 may include a bent area and, accordingly be bent in the bent area.

The substrate 101 may include glass or metal. In addition, the substrate 101 may include various flexible or bendable materials. For example, the substrate 101 may include a polymer resin such as polyethersulfone, polyacrylate, polyetherimide, polyethylene naphthalate, polyethylene terephthalate, polyphenylene sulfide, polyarylate, polyimide, polycarbonate, and cellulose acetate propionate.

The substrate 101 may have a multi-layered structure including two layers and a barrier layer. Here, the two layers may include the above polymer resin, and the barrier layer may include an inorganic material disposed between the two layers. The substrate 101 may be variously modified. In this case, the barrier layer may include silicon oxide, silicon nitride, and/or silicon oxynitride.

A plurality of display elements may be disposed in the display area DA. For example, the display element may include an organic light-emitting diode OLED (see FIG. 2) which emits red, green, blue, or white light. A (sub) pixel disposed in the display area DA of the display apparatus of FIG. 1 includes the organic light-emitting diode OLED, a thin-film transistor, and a capacitor. The thin-film transistor and the capacitor may be configured to control a light-emitting degree of the organic light-emitting diode OLED.

A driver, a power supply wiring, etc. may be disposed in the peripheral area PA. In addition, the peripheral area PA may include a pad area. The pad area may be a region to which various electronic elements such as a driving integrated circuit or a printed circuit board, etc. are electrically attached.

Figure 2:
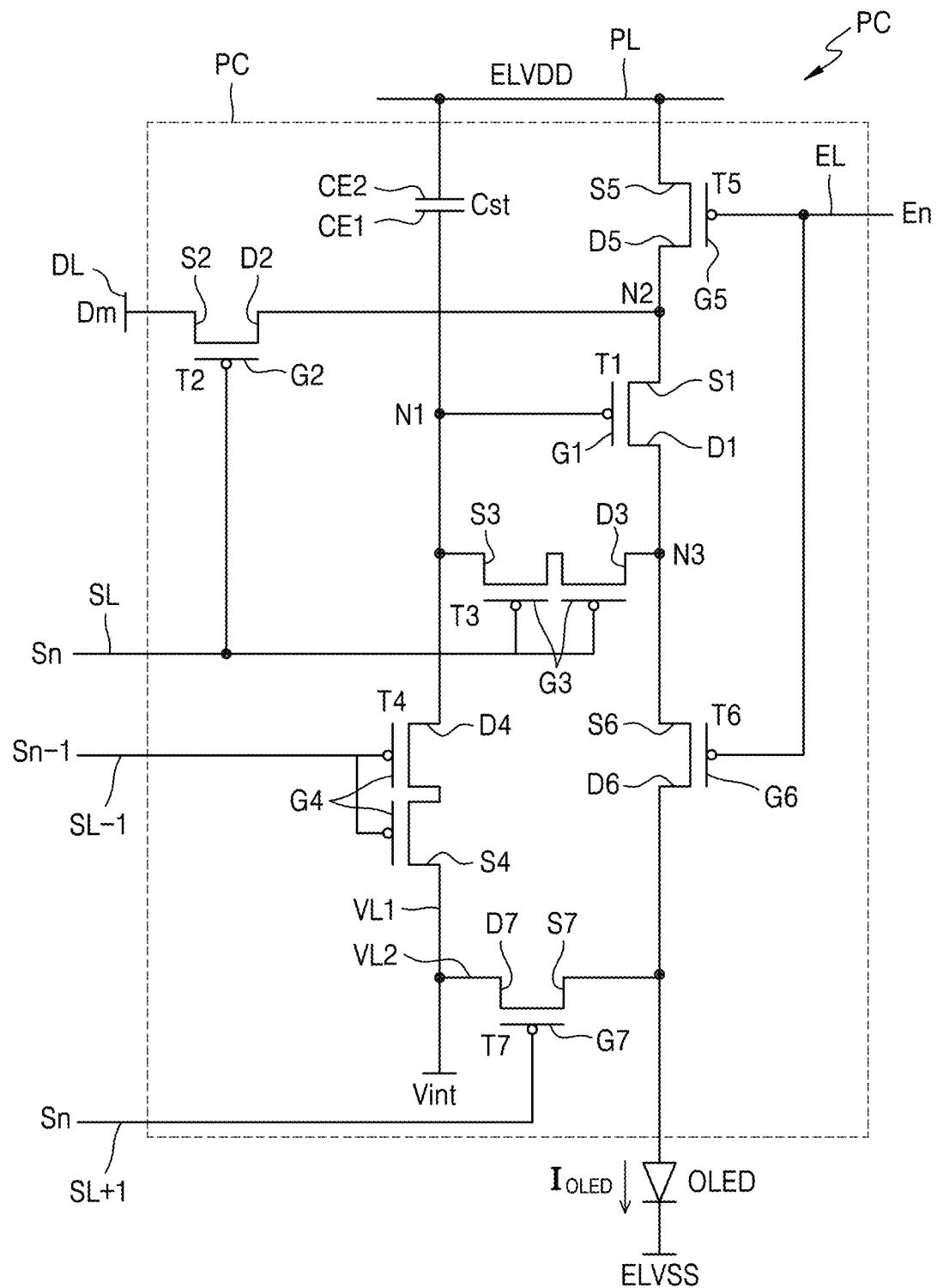
FIG. 2 is an equivalent circuit diagram of a pixel of the display apparatus of FIG. 1.

FIG. 2 is an embodiment of an equivalent circuit diagram of a (sub) pixel disposed in the display area DA of the display apparatus 1 of FIG. 1. A pixel circuit PC disposed in a (sub) pixel may include a plurality of thin-film transistors T1, T2, T3, T4, T5, T6, and T7 and a storage capacitor Cst. The plurality of thin-film transistors T1, T2, T3, T4, T5, T6, and T7 and the storage capacitor Cst may be connected to signal lines SL, SL−1, SL+1, EL, and DL, a first initialization voltage line VL1, a second initialization voltage line VL2, and a power voltage line PL.

The signal lines SL, SL−1, SL+1, EL, and DL may include the scan line SL, the previous scan line SL−1, the next scan line SL+1, the emission control line EL, and the data line DL. The scan line SL may be configured to transfer a scan signal Sn, the previous scan line SL−1 may be configured to transfer a previous scan signal Sn−1 to the first initialization thin film transistor T4, the next scan line SL+1 may be configured to transfer a scan signal Sn to the second initialization thin film transistor T7, the emission control line EL may be configured to transfer an emission control signal En to the operation control thin film transistor T5 and the emission control thin film transistor T6, and the data line DL may be configured to cross the scan line SL and transfer a data signal Dm. The power voltage line PL may be configured to transfer a driving voltage ELVDD to the driving thin film transistor T1, the first initialization voltage line VL1 may be configured to transfer an initialization voltage Vint to the first initialization thin film transistor T4, and the second initialization voltage line VL2 may be configured to transfer the initialization voltage Vint to the second initialization thin film transistor T7.

A driving gate electrode G1, which is a first gate electrode of the driving thin film transistor T1 (i.e., a first transistor), is connected to a bottom electrode CE1 of the storage capacitor Cst, a driving source region S1 of the driving thin film transistor T1 is connected to the driving voltage line PL through the operation control thin film transistor T5, and a driving drain region D1 of the driving thin film transistor T1 is electrically connected to a pixel electrode of a main organic light-emitting diode OLED through the emission control thin film transistor T6. That is, the driving thin-film transistor T1 may control an amount of current flowing from a second node N2 to the main organic light-emitting diode OLED in response to a voltage applied to a first node N1 (i.e., a voltage applied to the driving gate electrode G1). The second node N2 is connected to the power voltage line PL through the operation control thin-film transistor T5. Accordingly, the driving thin film transistor T1 receives a data signal Dm according to a switching operation of the switching thin-film transistor T2 to supply a driving current $I_{OLED}$ to the main organic light-emitting diode OLED. The operation control thin-film transistor T5 may be disposed between the second node N2 and the power voltage line PL.

A switching gate electrode G2, which is a second gate electrode of the switching thin film transistor T2 (i.e., a second transistor), is connected to the scan line SL, and a switching source region S2 of the switching thin film transistor T2 is connected to the data line DL. A switching drain region D2 of the switching thin film transistor T2 is connected to the second node N2 and thus connected to the power voltage line PL through the operation control thin film transistor T5 and simultaneously connected to the driving source region S1 of the driving thin film transistor T1. The switching thin film transistor T2 is turned on in response to a scan signal Sn transferred through the scan line SL and performs a switching operation of transferring a data signal Dm transferred through the data line DL to the driving source region S1 of the driving thin film transistor T1.

The compensation thin film transistor T3, which is a third transistor, may be connected between a third node N3 and the first node N1 to diode-connect the driving thin film transistor T1 in response to a voltage applied to a compensation gate electrode G3, which is a third gate electrode. The third node N3 is located between the driving thin film transistor T1 and the main organic light-emitting diode OLED. That is, the compensation gate electrode G3 of the compensation thin film transistor T3 is connected to the scan line SL. A compensation drain region D3 of the compensation thin film transistor T3 is connected to the driving drain region D1 of the driving thin film transistor T1 and connected to a pixel electrode of the main organic light-emitting diode OLED through the emission control thin film transistor T6. A compensation source region S3 of the compensation thin film transistor T3 is connected to the bottom electrode CE1 of the storage capacitor Cst, a first initialization drain region D4 of the first initialization thin film transistor T4, and the driving gate electrode G1 of the driving thin film transistor T1.

The compensation thin film transistor T3 is turned on in response to a scan signal Sn transferred through the scan line SL to diode-connect the driving thin film transistor T1 by electrically connecting the driving gate electrode G1 to the driving drain region D1 of the driving thin film transistor T1. The compensation thin film transistor T3 has a dual gate electrode. That is, the compensation gate electrode G3 of the compensation thin film transistor T3 has a (3-1)st gate electrode G3-1 (see FIG. 3) and a (3-2)nd gate electrode G3-2 (see FIG. 3).

The first initialization thin film transistor T4, which is a fourth transistor, may be connected between the first node N1 and the first initialization voltage line VL1 to initialize the voltage of the driving gate electrode G1 in response to a voltage applied to the first initialization gate electrode G4, which is a fourth gate electrode. That is, the first initialization gate electrode G4 of the first initialization thin film transistor T4 is connected to the previous scan line SL−1, a first initialization source region S4 of the first initialization thin film transistor T4 is connected to the first initialization voltage line VL1, and a first initialization drain region D4 of the first initialization thin film transistor T4 is connected to a bottom electrode CE1 of the storage capacitor Cst, the compensation source region S3 of the compensation thin film transistor T3, and the driving gate electrode G1 of the driving thin film transistor T1. The first initialization thin film transistor T4 is turned on according to a previous scan signal Sn−1 transferred through the previous scan line SL−1 and performs an initialization operation of initializing the voltage of the driving gate electrode G1 of the driving thin film transistor T1 by transferring the initialization voltage Vint to the driving gate electrode G1 of the driving thin film transistor T1.

The operation control thin film transistor T5, which is a fifth transistor, may be connected between the second node N2 and the power voltage line PL and turned on in response to a voltage applied to an operation control gate electrode G5, which is a fifth gate electrode. That is, the operation control gate electrode G5 of the operation control thin film transistor T5 is connected to the emission control line EL, an operation control source region S5 of the operation control thin film transistor T5 is connected to the power voltage line PL, and an operation control drain region D5 of the operation control thin film transistor T5 is connected to the driving source region S1 of the driving thin film transistor T1 and the switching drain region D2 of the switching thin film transistor T2.

The emission control thin film transistor T6, which is a sixth transistor, may be connected between the third node N3 and the main organic light-emitting diode OLED and turned on in response to a voltage applied from the emission control line EL to an emission control gate electrode G6, which is a sixth gate electrode. That is, the emission control gate electrode G6 of the emission control thin film transistor T6 is connected to the emission control line EL, and an emission control source region S6 of the emission control thin film transistor T6 is connected to the driving drain region D1 of the driving thin film transistor T1 and the compensation drain region D3 of the compensation thin film transistor T3. An emission control drain region D6 of the emission control thin film transistor T6 is electrically connected to a second initialization source region S7 of the second initialization thin film transistor T7 and the pixel electrode of the main organic light-emitting diode OLED.

The operation control thin film transistor T5 and the emission control thin film transistor T6 are simultaneously turned on according to the emission control signal En transferred through the emission control line EL to allow the driving voltage ELVDD to be transferred to the main organic light-emitting diode OLED and accordingly, allow the driving current $I_{OLED}$ to flow through the main organic light-emitting diode OLED.

A second initialization gate electrode G7 of the second initialization thin film transistor T7, which is a seventh transistor, is connected to the next scan line SL+1. The second initialization source region S7 of the second initialization thin film transistor T7 is connected to the emission control drain region D6 of the emission control thin film transistor T6 and the pixel electrode of the main organic light-emitting diode OLED. A second initialization drain region D7 of the second initialization thin film transistor T7 is connected to the second initialization voltage line VL2.

Since the scan line SL is electrically connected to the next scan line SL+1 (not shown), the same scan signal Sn may be applied to the scan line SL and the next scan line SL+1. Therefore, the second initialization thin film transistor T7 is turned on according to a scan signal Sn transferred through the next scan line SL+1 and may perform an operation of initializing the pixel electrode of the main organic light-emitting diode OLED. In another embodiment, the second initialization thin film transistor T7 may be omitted.

A top electrode CE2 of the storage capacitor Cst is connected to the power voltage line PL, and a common electrode of the main organic light-emitting diode OLED is connected to a common voltage ELVSS. Therefore, the main organic light-emitting diode OLED may display an image by receiving the driving current $I_{OLED}$ from the driving thin film transistor T1 and emitting light.

Though it is shown in FIG. 2 that the compensation thin film transistor T3 has a dual gate electrode, the embodiment according to the invention is not limited thereto. In another embodiment, for example, the compensation thin film transistor T3 may have one gate electrode. In addition, though it is shown in FIG. 2 that the first initialization thin film transistor T4 also has a dual gate electrode, the first initialization thin film transistor T4 may have one gate electrode in another embodiment.

For reference, though it is shown in FIG. 2 that the pixel circuit includes the seven thin film transistors together with a compensation circuit and one capacitor, the embodiment according to the invention is not limited thereto. For example, the pixel circuit may include three thin film transistors and one capacitor in another embodiment. In this case, each pixel circuit may not include a compensation circuit, and a compensation circuit disposed outside the display area DA may be used to prevent a brightness non-uniformity issue from occurring in the display area DA.

Figure 3:
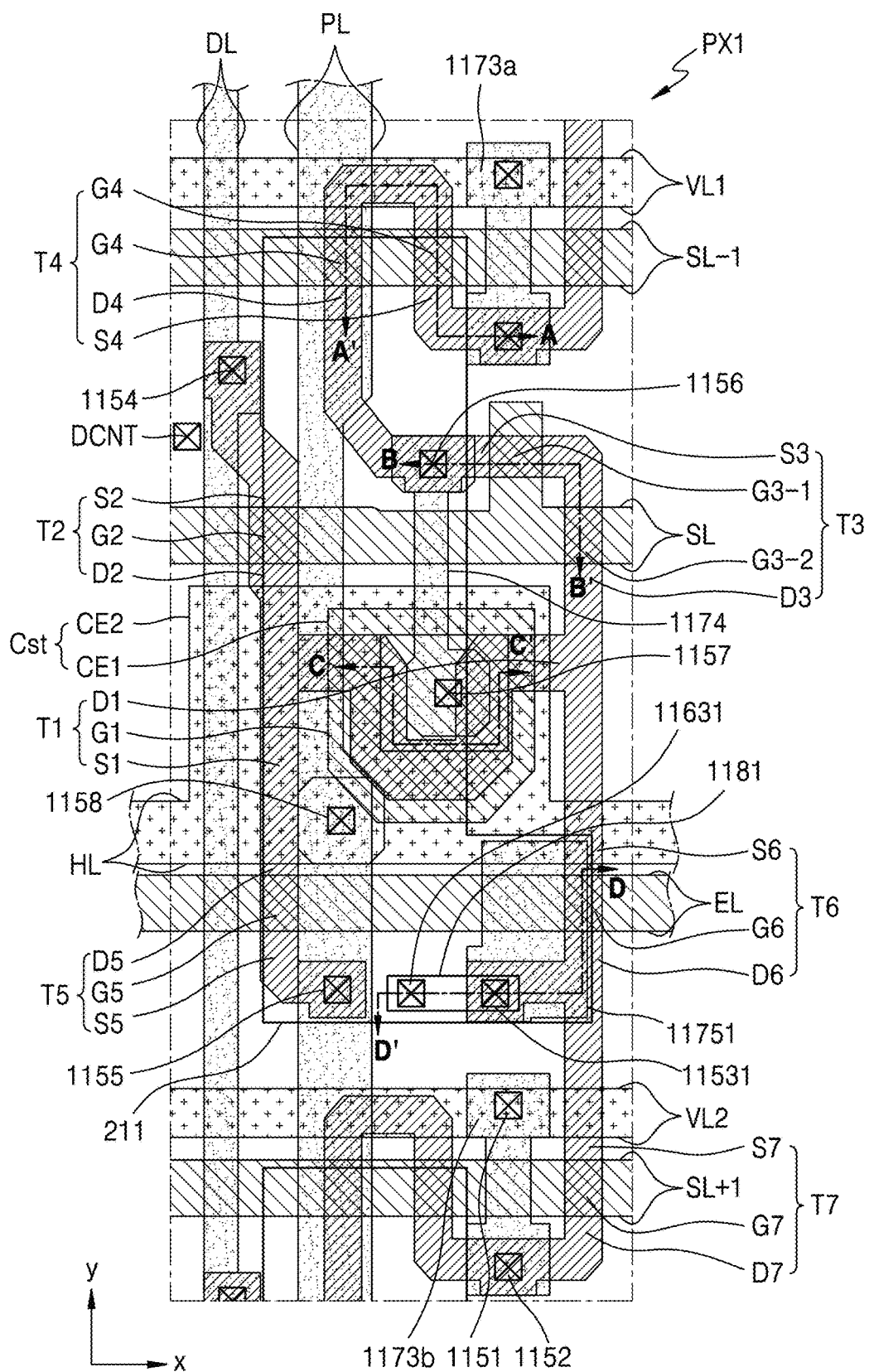
FIG. 3 is a layout view of positions of thin-film transistors, a capacitor, etc. in a region including the pixel circuit of FIG. 2.
Figure 4:
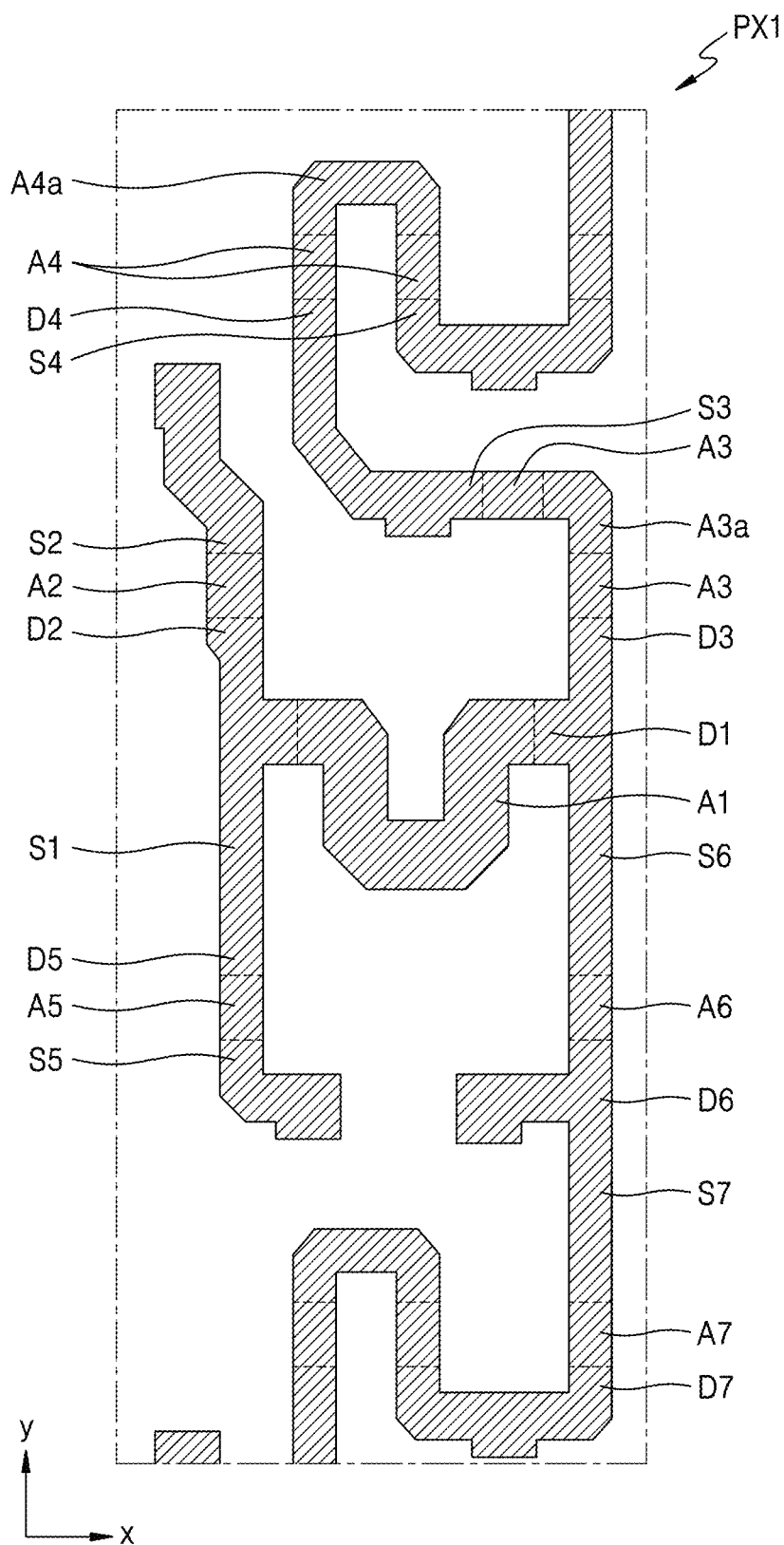
FIG. 4 is a layout view of a semiconductor layer of FIG. 3.
Figure 5:
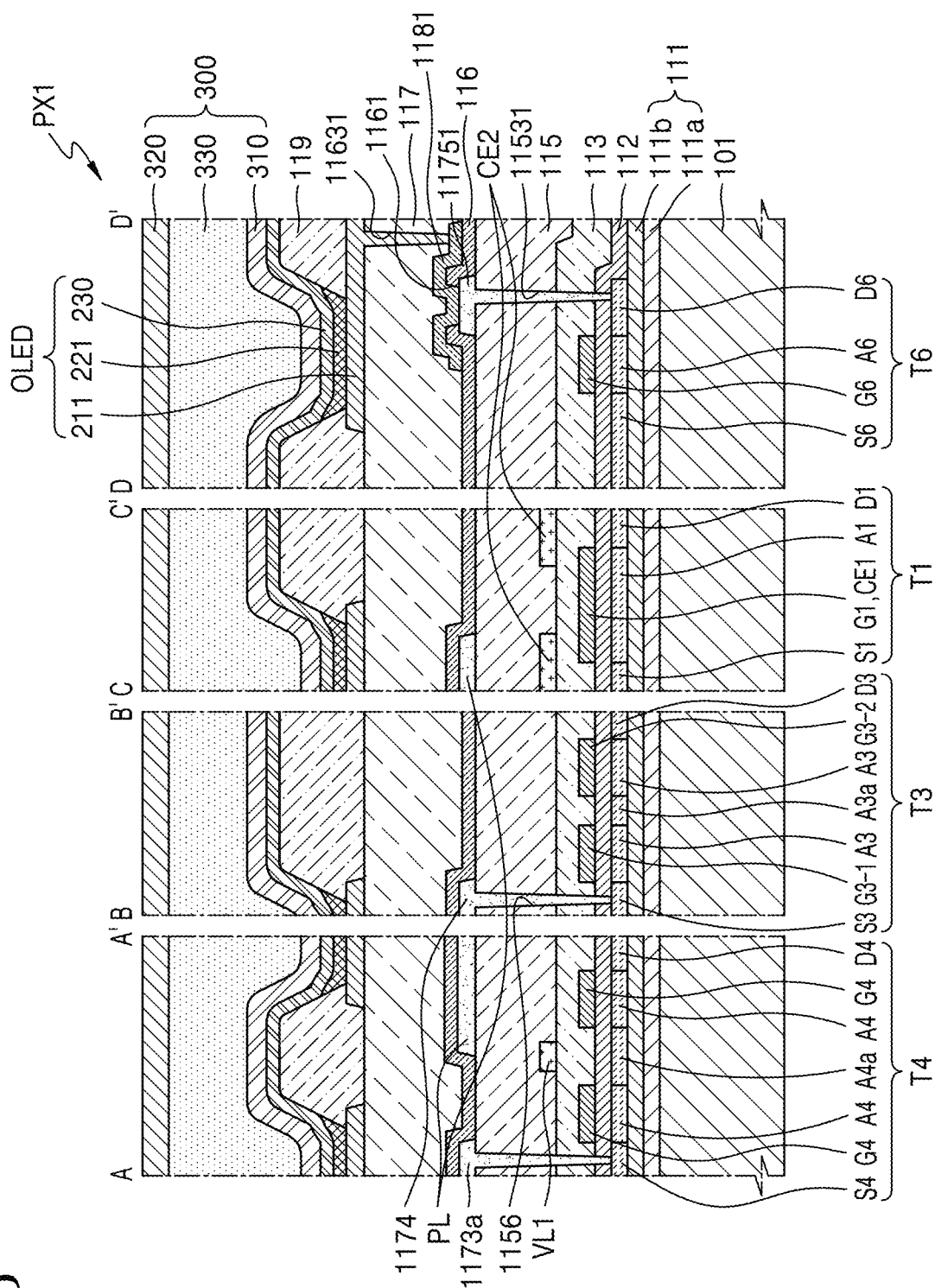
FIG. 5 is a cross-sectional view of portions of FIG. 3.

FIG. 3 is a layout view of the positions of a plurality of thin film transistors, a capacitor, etc. in a first region PX1 having the pixel circuit shown in FIG. 2, FIG. 4 is a layout view of a semiconductor layer, which is a portion of the display apparatus 1 of FIG. 3, and FIG. 5 is a cross-sectional view of portions of FIG. 3, showing the display apparatus 1, taken along lines A-A', B-B', C-C', and D-D' of FIG. 3. In the relevant cross-sectional view, the sizes of the elements are exaggerated and/or reduced, for convenience. This is also applied to cross-sectional views below.

The driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7 are disposed along a semiconductor layer. Some regions of the semiconductor layer may constitute semiconductor layers of the driving thin film transistor T1, the switching thin film transistor T2, the compensation thin film transistor T3, the first initialization thin film transistor T4, the operation control thin film transistor T5, the emission control thin film transistor T6, and the second initialization thin film transistor T7. That is, some regions of the semiconductor layer may constitute an active region, a source region, or a drain region of a thin film transistor.

The semiconductor layer may be disposed over the substrate 101. A buffer layer 111 may be disposed on the substrate 101, and the semiconductor layer may be disposed on the buffer layer 111.

The buffer layer 111 may reduce or block the penetration of foreign substances or external air from below the substrate 101 and may provide a flat surface on the substrate 101. The buffer layer 111 may include an inorganic material such as oxide or nitride, an organic material, or an organic/inorganic composite material and include a single layer or a multi-layer including an inorganic material and an organic material. As an example, the buffer layer 111 may have a structure in which a first buffer layer 111a and a second buffer layer 111b are stacked. In this case, the first buffer layer 111a and the second buffer layer 111b may include different materials from each other. As an example, the first buffer layer 111a may include silicon nitride, and the second buffer layer 111b may include silicon oxide.

As described above, in the case where the first buffer layer 111a includes silicon nitride, hydrogen may be included in the silicon nitride while silicon nitride is formed. Through this, carrier mobility of the semiconductor layer disposed on the buffer layer 111 improves, and accordingly, an electric characteristic of a thin film transistor may improve. In addition, the semiconductor layer may include silicon material. In this case, an interface adhesion characteristic between the semiconductor layer containing silicon and the second buffer layer 111b containing silicon oxide improves, and accordingly, an electric characteristic of a thin film transistor may improve.

The semiconductor layer may include low temperature polycrystalline silicon ("LTPS"). Since polycrystalline silicon has a high electron mobility (e.g., 100 square centimeters per voltage second: $cm^2/Vs$ or more), energy consumption is low and reliability is excellent. As another example, the semiconductor layer may include amorphous silicon (a-Si) and/or an oxide semiconductor. Alternatively, some of semiconductor layers of a plurality of thin film transistors may include an LTPS, and others may include amorphous silicon and/or an oxide semiconductor.

The source regions and the drain regions of the semiconductor layer may be doped with impurities. Here, the impurities may include N-type impurities or P-type impurities. The source region and the drain region may correspond to a source electrode and a drain electrode, respectively. The source region and the drain region may be switched to each other depending on the property of a thin film transistor. Hereinafter, terms a 'source region' and a 'drain region' instead of a source electrode or a drain electrode are used. It is shown in FIG. 5 that specific portions of a semiconductor layer are doped with P-type impurities, and accordingly, thin film transistors are implemented as p-channel metal oxide field effect transistors ("MOSFET"). Other portions of the semiconductor layer may be also doped with impurities and may serve as a wiring electrically connecting the thin film transistors and/or the capacitor, etc.

A first gate insulating layer 112 is disposed on the semiconductor layer. The driving gate electrode G1, the scan line SL, the previous scan line SL−1, the next scan line SL+1, and the emission control line EL may be disposed on the first gate insulating layer 112. The first gate insulating layer 112 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

Regions of the scan line SL that overlap second and third active regions A2 and A3 of the switching and compensation thin film transistors T2 and T3 in a plan view may include the switching gate electrode G2 and the compensation gate electrode G3, respectively. A region of the previous scan line SL−1 that overlaps a fourth active region A4 of the first initialization thin film transistor T4 may include the first initialization gate electrode G4. A region of the next scan line SL+1 that overlaps a seventh active region A7 of the second initialization thin film transistor T7 in the plan view may include the seventh initialization gate electrode G7. Regions of the emission control line EL that overlap fifth and sixth active regions A5 and A6 of the operation control and emission control thin film transistors T5 and T6 may include the operation control gate electrode G5 and the emission control gate electrode G6, respectively.

The driving gate electrode G1, the scan line SL, the previous scan line SL−1, the next scan line SL+1, and the emission control line EL may include a conductive material including molybdenum (Mo), aluminum (Al), copper (Cu), and/or titanium (Ti) and have a single-layered structure or a multi-layered structure including the above materials. As an example, the driving gate electrode G1, the scan line SL, the previous scan line SL−1, the next scan line SL+1, and the emission control line EL may have a multi-layered structure of Mo/Al or a multi-layered structure of Mo/Al/Mo.

A second gate insulating layer 113 may be disposed on the driving gate electrode G1, the scan line SL, the previous scan line SL−1, the next scan line SL+1, and the emission control line EL. The second gate insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

An electrode voltage line HL, the first initialization voltage line VL1, and the second initialization voltage line VL2 may be disposed on the second gate insulating layer 113. The electrode voltage line HL may cover at least a portion of the driving gate electrode G1 and constitute a storage capacitor Cst in cooperation with the driving gate electrode G1.

The bottom electrode CE1 of the storage capacitor Cst may be formed as one body with the driving gate electrode G1 of the driving thin film transistor T1. For example, the driving gate electrode G1 of the driving thin film transistor T1 may also serve as the bottom electrode CE1 of the storage capacitor Cst. A region of the electrode voltage line HL that overlaps the driving gate electrode G1 may also serve as the top electrode CE2 of the storage capacitor Cst. Therefore, the second gate insulating layer 113 may serve as a dielectric layer of the storage capacitor Cst.

The electrode voltage line HL, the first initialization voltage line VL1, and the second initialization voltage line VL2 may include a conductive material including molybdenum (Mo), aluminum (Al), copper (Cu), and/or titanium (Ti) and have a single-layered structure or a multi-layered structure including the above materials. As an example, the electrode voltage line HL, the first initialization voltage line VL1, and the second initialization voltage line VL2 may have a multi-layered structure of Mo/Al or a multi-layered structure of Mo/Al/Mo.

An interlayer-insulating layer 115 is disposed on the electrode voltage line HL, the first initialization voltage line VL1, and the second initialization voltage line VL2. The interlayer-insulating layer 115 may include $SiO_2$, $SiN_x$, SiON, $Al_2O_3$, $TiO_2$, $Ta_2O_5$, $HfO_2$, and/or $ZnO_2$.

A data line DL, the power voltage line PL, first and second initialization connection lines 1173a and 1173b, a node connection line 1174, and a first pixel connection metal 11751 may be disposed on the interlayer-insulating layer 115. The data line DL, the power voltage line PL, the node connection line 1174, and the first pixel connection metal 11751 may include a conductive material including molybdenum (Mo), aluminum (Al), copper (Cu), and/or titanium (Ti) and have a single-layered structure or a multi-layered structure including the above materials. As an example, the data line DL, the power voltage line PL, the node connection line 1174, and the first pixel connection metal 11751 may have a multi-layered structure of Ti/Al/Ti.

The data line DL may be connected to the switching source region S2 of the switching thin film transistor T2 through a contact hole 1154. In an embodiment, a portion of the data line DL may be used as a switching source electrode.

The power voltage line PL may be connected to the top electrode CE2 of the storage capacitor Cst through a contact hole 1158 defined in the interlayer-insulating layer 115. Therefore, the electrode voltage line HL may have the same voltage level (a constant voltage) as the power voltage line PL. In addition, the power voltage line PL may be connected to the operation control drain region D5 through a contact hole 1155.

The first initialization voltage line VL1 may be connected to the first initialization thin film transistor T4 through a first initialization connection line 1173a, and the second initialization voltage line VL2 may be connected to the second initialization thin film transistor T7 through a second initialization connection line 1173b. The first initialization voltage line VL1 and the second initialization voltage line VL2 may have the same constant voltage (e.g. −2V, etc.).

One end of the node connection line 1174 may be connected to the compensation source region S3 through a contact hole 1156, and the other end of the node connection line 1174 may be connected to the driving gate electrode G1 through a contact hole 1157.

The first pixel connection metal 11751 is connected to the semiconductor layer of the emission control thin film transistor T6 through a first pixel interlayer contact hole 11531 passing through the interlayer-insulating layer 115, the second gate insulating layer 113, and the first gate insulating layer 112. Specifically, the first pixel connection metal 11751 contacts the emission control drain region D6 of the emission control thin film transistor T6 through the first pixel interlayer contact hole 11531. A semiconductor layer including the emission control drain region D6 in the first region PX1 may be referred to as a first pixel semiconductor layer, for convenience.

The data line DL, the power voltage line PL, the first and second initialization connection lines 1173a and 1173b, the node connection line 1174, and the first pixel connection metal 11751 are covered by a protective insulating layer 116. The protective insulating layer 116 may include an inorganic material. Specifically, the protective insulating layer 116 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$).

A first pixel bridge electrode 1181 is disposed on the protective insulating layer 116. The first pixel bridge electrode 1181 contacts a first pixel connection metal 11751 through a first pixel protective contact hole 1161 of the protective insulating layer 116. In addition, the first pixel bridge electrode 1181 is connected to a first pixel electrode 211 of an organic light-emitting diode OLED through a first pixel contact hole 11631 defined thereon. Therefore, the emission control thin film transistor T6 in the first region PX1 may be electrically connected to the first pixel electrode 211 of the organic light-emitting diode OLED through the first pixel connection metal 11751 and the first pixel bridge electrode 1181. For reference, though the first pixel protective contact hole 1161 is not shown in FIG. 6, for convenience, the first pixel protective contact hole 1161 may be disposed to almost overlap a first pixel interlayer contact hole 11531 in the plan view (see FIG. 5).

The first pixel bridge electrode 1181 may include various conductive materials. For example, the first pixel bridge electrode 1181 may include a conductive material including molybdenum (Mo), aluminum (Al), copper (Cu), and/or titanium (Ti) and have a single-layered structure or a multi-layered structure including the above materials. As an example, the first pixel bridge electrode 1181 may have a multi-layered structure of Ti/Al/Ti.

A planarization layer 117 is disposed on the first pixel bridge electrode 1181. The organic light-emitting diode OLED may be disposed on the planarization layer 117.

Though FIG. 2 shows one pixel circuit PC and FIG. 3 describes the structure of one (sub) pixel in the first region PX1, a plurality of sub-pixels having the same pixel circuit PC may be arranged in a first direction (an x-axis direction) and a second direction (a y-axis direction) to have a matrix form. In this case, the first initialization voltage line VL1, the previous scan line SL−1, the second initialization voltage line VL2, and the next scan line SL+1 may be shared by two pixel circuits PC neighboring each other in the second direction (the y-axis direction).

That is, the first initialization voltage line VL1 and the previous scan line SL−1 may be electrically connected to the second initialization thin film transistor in another region disposed above (a (+) y-direction) the first region PX1 along the second direction (the y-axis direction) in FIG. 3. Therefore, a previous scan signal applied to the previous scan line SL−1 may be transferred, as a next scan signal, to the second initialization thin film transistor in the another region. Likewise, the second initialization voltage line VL2 and the next scan line SL+1 may be electrically connected to the first initialization thin film transistor in still another region disposed below (a (−) y-direction) of the first region PX1 along the second direction (the y-axis direction) in FIG. 3 to transfer a previous scan signal and the initialization voltage to the first initialization thin film transistor of the still another region.

Referring to FIG. 5 again, the planarization layer 117 may have a flat top surface such that the first pixel electrode 211 disposed on the planarization layer 117 is also flat. The planarization layer 117 may include an organic material and have a single-layered structure or a multi-layered structure. The planarization layer 117 may include a general-purpose polymer such as benzocyclobutene ("BOB"), polyimide, hexamethyldisiloxane ("HMDSO"), polymethylmethacrylate ("PMMA") or polystyrene ("PS"), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. The planarization layer 117 may include an inorganic material. The planarization layer 117 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_2$). In the case where the planarization layer 117 includes an inorganic material, chemical planarization polishing may be performed depending on the case. The planarization layer 117 may include both an organic material and an inorganic material.

The organic light-emitting diode OLED in the first region PX1 may include the first pixel electrode 211, a common electrode 230, and a first intermediate layer 221. The first intermediate layer 221 may be disposed between the first pixel electrode 211 and the common electrode 230 and include an emission layer.

The first pixel electrode 211 may be connected to the first pixel bridge electrode 1181 through the first pixel contact hole 11631. The first pixel bridge electrode 1181 may be connected to the first pixel connection metal 11751 through the first pixel protective contact hole 1161. The first pixel connection metal 11751 may be connected to the emission control drain region D6 in the first region PX1 through the first pixel interlayer contact hole 11531. The first pixel electrode 211 may include a (semi) transparent electrode or a reflective electrode. In an embodiment, the first pixel electrode 211 may include a reflective layer and a transparent or semi-transparent electrode layer on the reflective layer. Here, the reflective layer may include silver (Ag), magnesium (Mg), aluminum (Al), platinum (Pt), palladium (Pd), gold (Au), nickel (Ni), neodymium (Nd), iridium (Ir), chrome (Cr), or a compound thereof. The transparent or semi-transparent electrode layer may include at least one of indium tin oxide ("ITO"), indium zinc oxide ("IZO"), zinc oxide (ZnO), indium oxide ($In_2O_3$), indium gallium oxide ("IGO"), and aluminum zinc oxide ("AZO"). In an embodiment, the first pixel electrode 211 may include a stacked structure of ITO/Ag/ITO.

A pixel-defining layer 119 may be disposed on the planarization layer 117. The pixel-defining layer 119 may define an emission area of a pixel by including an opening that exposes the central portion of the first pixel electrode 211. In addition, the pixel-defining layer 119 may prevent an arc, etc. from occurring at the edges of first pixel electrode 211 by increasing a distance between the edges of the first pixel electrode 211 and the common electrode 230 over the first pixel electrode 211. The pixel-defining layer 119 may include an organic insulating material such as polyimide, polyamide, an acrylic resin, HMDSO, and a phenolic resin and be formed through spin coating, etc.

The first intermediate layer 221 may include an organic emission layer. The organic emission layer may include an organic material including a fluorescent or phosphorous material emitting red, green, blue, or white light. The organic emission layer may include a low molecular weight organic material and/or a polymer organic material. A functional layer such as a hole transport layer ("HTL"), a hole injection layer ("HIL"), an electron transport layer ("ETL"), and an electron injection layer ("EIL") may be selectively further disposed on and under the organic emission layer. The first intermediate layer 221 may be disposed to correspond to each first pixel electrode 211. However, the embodiment according to the invention is not limited thereto, and a layer such as an HTL, an HIL, an ETL, or an EIL among layers of the first intermediate layer 221 may be formed as one body over the first pixel electrode 211 in the first region PX1 and pixel electrodes in other regions in another embodiment. The first intermediate layer 221 may be formed through various methods such as inkjet printing, deposition, or laser heat transfer.

The common electrode 230 may include a transparent electrode or a reflective electrode. In an embodiment, the common electrode 230 may include a transparent or semi-transparent electrode and a metal thin layer including at least one of Li, Ca, LiF/Ca, LiF/Al, Al, Ag, Mg, and a compound thereof and having a small work function. In addition, besides the metal thin layer, the common electrode 230 may further include a transparent conductive oxide ("TCO") such as ITO, IZO, ZnO, or $In_2O_3$. The common electrode 230 may be formed as one body over the first pixel electrode 211 in the first region PX1 and pixel electrodes in other regions.

An encapsulation layer 300 may be disposed on the common electrode 230, the encapsulation layer 300 including a first inorganic encapsulation layer 310, a second inorganic encapsulation layer 320, and an organic encapsulation layer 330 disposed therebetween.

The first inorganic encapsulation layer 310 and the second inorganic encapsulation layer 320 may include silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), and/or zinc oxide (ZnO$_2$). The organic encapsulation layer 330 may include polyethylene terephthalate, polyethylene naphthalate, polycarbonate, polyimide, polyethylene sulfonate, polyoxymethylene, polyarylate, hexamethyldisiloxane, an acrylic resin (e.g. polymethylmethacrylate, poly acrylic acid, etc.), or an arbitrary combination thereof.

In the organic light-emitting display apparatus according to an embodiment, the first pixel electrode 211 does not directly contact the first pixel connection metal 11751 but is electrically connected to the first pixel connection metal 11751 through the first pixel bridge electrode 1181. Accordingly, the position of the first pixel contact hole 11631 through which the first pixel electrode 211 passes the planarization layer 117 may not be limited by a region of the first pixel connection metal 11751.

The first pixel connection metal 11751 is disposed on the interlayer-insulating layer 115. Besides the first pixel connection metal 11751, the data line DL, the power voltage line PL, the first and second initialization connection lines 1173*a* and 1173*b* and/or the node connection line 1174 are disposed on the interlayer-insulating layer 115. Accordingly, the position of the first pixel connection metal 11751 is limited inside the first region PX1, and in a case that the first pixel electrode 211 directly contacts the first pixel connection metal 11751, the position of the first pixel contact hole 11631 is also limited.

In contrast, in the organic light-emitting display apparatus according to the present embodiment, the first pixel electrode 211 is electrically connected to the first pixel connection metal 11751 through the first pixel bridge electrode 1181. Accordingly, the position of the first pixel contact hole 11631 through which the first pixel electrode 211 passes inside the planarization layer 117 may not be limited by a region of the first pixel connection metal 11751. Accordingly, when viewed in a direction perpendicular to the substrate 101 (i.e., plan view), the first pixel contact hole 11631 may be defined outside the first pixel protective contact hole 1161. Furthermore, as shown in FIGS. 3 and 5, when viewed in a direction perpendicular to the substrate 101 (i.e., plan view), the first pixel contact hole 11631 may be defined outside the first pixel connection metal 11751.

For reference, as shown in FIG. 5, the pixel-defining layer 119 covers the edges of the first pixel electrode 211 and also covers a portion of the first pixel electrode 211 that corresponds to the first pixel contact hole 11631. In the organic light-emitting display apparatus according to the present embodiment, the position of the first pixel contact hole 11631 through which the first pixel electrode 211 passes inside the planarization layer 117 is not limited by a region of the first pixel connection metal 11751. Accordingly, the position of the first pixel contact hole 11631 may be easily changed. As a result, since the size of the opening of the pixel-defining layer 119 that exposes the first pixel electrode 211 may be easily widened when needed, an aperture ratio may be increased.

When forming the first intermediate layer 221, for example, when forming an emission layer of the first intermediate layer 221, the emission layer may be formed through inkjet printing. When forming a layer of the first intermediate layer 221 through inkjet printing, the top surface of the first pixel electrode 211 needs to be flat. When the top surface of the first pixel electrode 211 is not flat, the thickness of a layer formed through inkjet printing will not be uniform due to the characteristic of inkjet printing, which is a liquid process. Therefore, the top surface of the planarization layer 117 on which the first pixel electrode 211 is disposed needs to be flat. In the related art, for this, the thickness of the planarization layer 117 should be made sufficiently thick and accordingly, the depth of the first pixel contact hole 11631 inside the planarization layer 117 is deep. Since the inner surface of the first pixel contact hole 11631 has a shape that is oblique, not perpendicular with respect to the substrate 101, as the depth of the first pixel contact hole 11631 is deep, the area of a portion of the first pixel electrode 211 on the first pixel contact hole 11631 increases. Since the pixel-defining layer 119 covers a portion of the first pixel electrode 211 on the first pixel contact hole 11631, the size of the opening of the pixel-defining layer 119 that exposes the first pixel electrode 211 is limited.

In contrast, in the organic light-emitting display apparatus according to the present embodiment, the position of the first pixel contact hole 11631 through which the first pixel electrode 211 passes inside the planarization layer 117 is not limited by a region of the first pixel connection metal 11751. Accordingly, the position of the first pixel contact hole 11631 may be easily changed. As a result, since the size of the opening of the pixel-defining layer 119 that exposes the first pixel electrode 211 may be easily widened when needed, an aperture ratio may be increased.

For reference, though it is shown in FIGS. 3 to 5 that the pixel circuit includes seven thin film transistors and one capacitor together with a compensation circuit, the embodiment according to the invention is not limited thereto. As an example, the pixel circuit may include three thin film transistors and one capacitor in another embodiment. In this case, each pixel circuit may not include a compensation circuit and a compensation circuit disposed outside the display area DA may be used to prevent a brightness non-uniformity issue from occurring in the display area DA.

Figure 6:
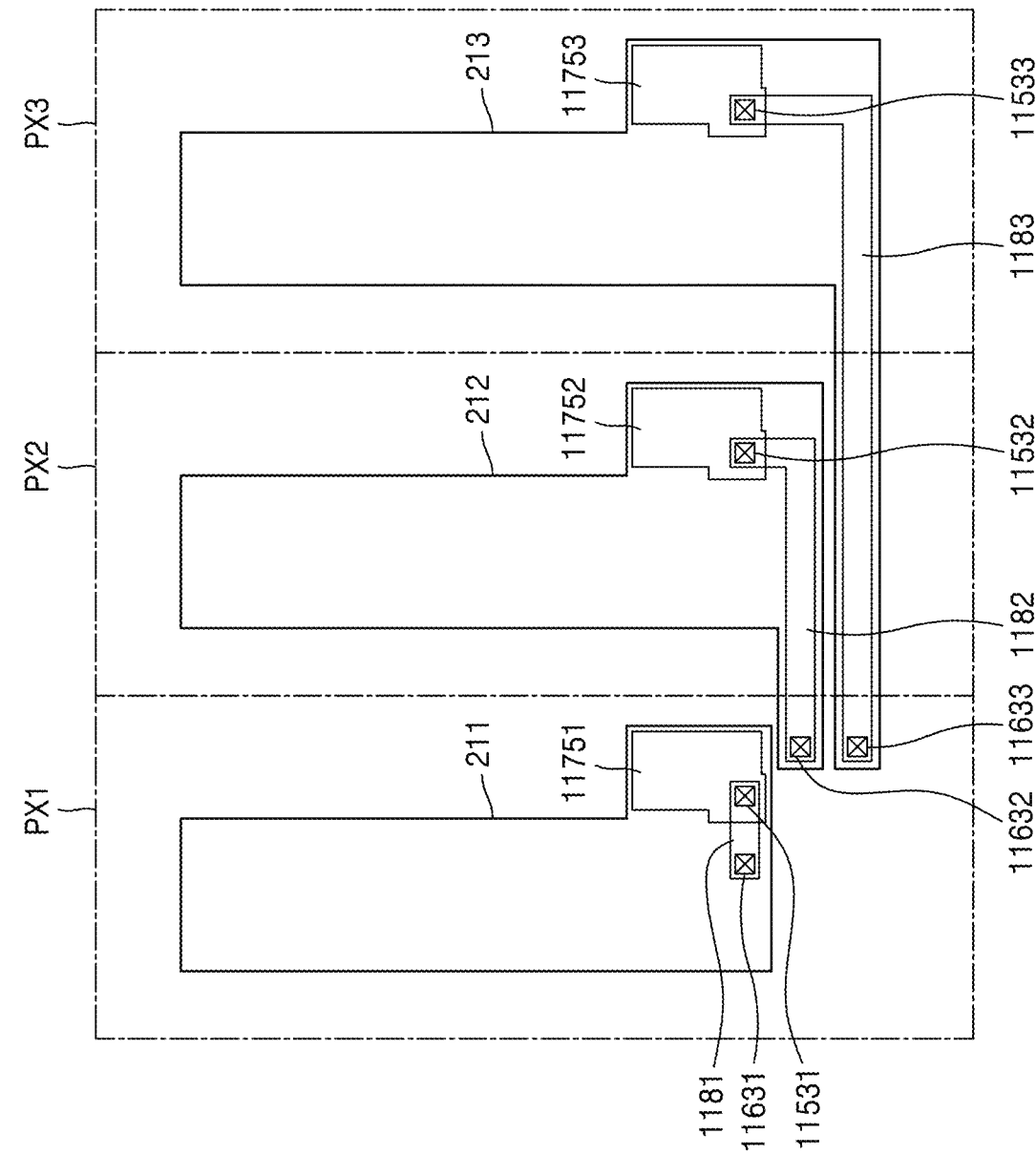
FIG. 6 is a layout view of some elements of pixels of the display apparatus of FIG. 1.

FIG. 6 is a layout view of some elements of pixels of the display apparatus of FIG. 1. FIG. 6 shows a second region PX2 in addition to the first region PX1. The first region PX1 shown in FIG. 6 may have the same structure as the first region PX1 of the organic light-emitting display apparatus according to the embodiment described with reference to FIGS. 3 to 5.

Elements having a similar structure to the first region PX1 may be disposed in the second region PX2 of the substrate 101. As an example, a second pixel semiconductor layer is disposed over the substrate 101. The second pixel semiconductor layer includes a second pixel drain region in the second region PX2. The second pixel semiconductor layer may have the same structure as the first pixel semiconductor layer having the first pixel drain region D6 in the first region PX1 shown in FIG. 5.

A second pixel connection metal 11752 is disposed on the interlayer-insulating layer 115 covering the second pixel semiconductor layer and contacts the second pixel drain region through a second pixel interlayer contact hole 11532 of the interlayer-insulating layer 115. A second pixel bridge electrode 1182 is disposed on the protective insulating layer 116 covering the second pixel connection metal 11752 and contacts the second pixel connection metal 11752 through a second pixel protective contact hole of the protective insulating layer 116. Though FIG. 6 does not show the second pixel protective contact hole, for convenience, the second pixel protective contact hole may be defined to almost overlap the second pixel interlayer contact hole 11532 in the plan view. This is also applied to embodiments below and modifications thereof. The position relations of the second pixel connection metal 11752, the second pixel interlayer contact hole 11532, the second pixel bridge electrode 1182, and the second pixel protective contact hole are the same as/similar to the position relations of the first pixel connection metal 11751, the first pixel interlayer contact hole 11531, the first pixel bridge electrode 1181, and the first pixel protective contact hole 1161.

The second pixel electrode 212 is disposed on the planarization layer 117 covering the second pixel bridge electrode 1182 and contacts the second pixel bridge electrode 1182 through a second pixel contact hole 11632 of the planarization layer 117. In this case, when viewed in a direction perpendicular to the substrate 101 (i.e., plan view), the second pixel contact hole 11632 is defined outside the second pixel protective contact hole. Specifically, when viewed in a direction perpendicular to the substrate 101 (i.e., plan view), the second pixel contact hole 11632 may be defined outside the second pixel connection metal 11752.

In the organic light-emitting display apparatus according to the present embodiment, the second pixel electrode 212 does not directly contact the second pixel connection metal 11752 but is electrically connected to the second pixel connection metal 11752 through the second pixel bridge electrode 1182. Accordingly, the position of the second pixel contact hole 11632 through which the second pixel electrode 212 passes inside the planarization layer 117 may not be limited by a region of the second pixel connection metal 11752.

The second pixel connection metal 11752 is disposed on the interlayer-insulating layer 115. Various conductive layers besides the second pixel connection metal 11752 are disposed on the interlayer-insulating layer 115. Accordingly, the position of the second pixel connection metal 11752 is limited inside the second region PX2, and when the second pixel electrode 212 directly contacts the second pixel connection metal 11752, the position of the second pixel contact hole 11632 is also limited.

In contrast, in the organic light-emitting display apparatus according to the present embodiment, the second pixel electrode 212 is electrically connected to the second pixel connection metal 11752 through the second pixel bridge electrode 1182. Accordingly, the position of the second pixel contact hole 11632 through which the second pixel electrode 212 passes inside the planarization layer 117 may not be limited by a region of the second pixel connection metal 11752. Accordingly, when viewed in a direction perpendicular to the substrate 101 (i.e., plan view), the second pixel contact hole 11632 may be defined outside the second pixel protective contact hole. Furthermore, as shown in FIG. 6, when viewed in a direction perpendicular to the substrate 101 (i.e., plan view), the second pixel contact hole 11632 may be defined outside the second pixel connection metal 11752.

For reference, the pixel-defining layer 119 covers the edges of the second pixel electrode 212 and also covers a portion of the second pixel electrode 212 that corresponds to the second pixel contact hole 11632. In the organic light-emitting display apparatus according to the present embodiment, the position of the second pixel contact hole 11632 through which the second pixel electrode 212 passes inside the planarization layer 117 is not limited by a region of the second pixel connection metal 11752. Accordingly, the position of the second pixel contact hole 11632 may be easily changed. As a result, since the size of the opening of the pixel-defining layer 119 that exposes the second pixel electrode 212 may be easily widened when needed, an aperture ratio may be increased.

In addition, as shown in FIG. 6, the second pixel contact hole 11632 may be defined in the first region PX1, not the second region PX2. Accordingly, the area of the second pixel electrode 212 in the second region PX2 may be remarkably widened. In this case, the area of the second pixel electrode 212 may be greater than the area of the first pixel electrode 211.

As an example, when a light-emitting efficiency of a second emission layer on the second pixel electrode 212 in the second region PX2 is less than a light-emitting efficiency of a first emission layer on the first pixel electrode 211 in the first region PX1, it is required that the area of the second emission layer is greater than the area of the first emission layer when viewed in a direction perpendicular to the substrate 101 (i.e., plan view). In the organic light-emitting display apparatus according to the present embodiment, since the area of the second pixel electrode 212 may be greater than the area of the first pixel electrode 211, the area of the second emission layer may be greater than the area of the first emission layer. The second emission layer may include an emission layer that emits, for example, light in a green wavelength, and the first emission layer may include an emission layer that emits, for example, light in a red wavelength.

Unlike FIG. 6, the second pixel contact hole 11632 may not be defined in the first region PX1 but be disposed in the second region PX2 and may neighbor the first region PX1. This is also applied to embodiments below and modifications thereof.

FIG. 6 shows the third region PX3 in addition to the first region PX1 and the second region PX2. The first to third pixels PX1, PX2, and PX3 may be sequentially disposed. The third region PX3 shown in FIG. 6 may have the same structure as the first region PX1 of the organic light-emitting display apparatus according to the above embodiment described with reference to FIGS. 3 to 5.

Elements having a similar structure to that in the first region PX1 may be disposed also in the third region PX3 of the substrate 101. As an example, a third pixel semiconductor layer is disposed over the substrate 101 and includes a third pixel drain region in the third region PX3. The third pixel semiconductor layer may have the same structure as the first pixel semiconductor layer having the first pixel drain region D6 in the first region PX1 shown in FIG. 5.

A third pixel connection metal 11753 is disposed on the interlayer-insulating layer 115 covering the third pixel semiconductor layer and contacts the third pixel drain region through a third pixel interlayer contact hole 11533 of the interlayer-insulating layer 115. A third pixel bridge electrode 1183 is disposed on the protective insulating layer 116 covering the third pixel connection metal 11753 and contacts the third pixel connection metal 11753 through a third pixel protective contact hole of the protective insulating layer 116. Though FIG. 6 does not show the third pixel protective contact hole, for convenience, the third pixel protective contact hole may be defined to almost overlap the third pixel interlayer contact hole 11533 in the plan view. This is also applied to embodiments below and modifications thereof. The position relations of the third pixel connection metal 11753, the third pixel interlayer contact hole 11533, the third pixel bridge electrode 1183, and the third pixel protective contact hole are the same as/similar to the position relations of the first pixel connection metal 11751, the first pixel interlayer contact hole 11531, the first pixel bridge electrode 1181, and the first pixel protective contact hole 1161.

The third pixel electrode 213 is disposed on the planarization layer 117 covering the third pixel bridge electrode 1183 and contacts the third pixel bridge electrode 1183 through a third pixel contact hole 11633 of the planarization layer 117. In this case, when viewed in a direction perpendicular to the substrate 101 (i.e., plan view), the third pixel contact hole 11633 is defined outside the third pixel protective contact hole. Specifically, when viewed in a direction perpendicular to the substrate 101 (i.e., plan view), the third pixel contact hole 11633 may be defined outside the third pixel connection metal 11753.

In the organic light-emitting display apparatus according to the present embodiment, the third pixel electrode 213 does not directly contact the third pixel connection metal 11753 but is electrically connected to the third pixel connection metal 11753 through the third pixel bridge electrode 1183. Accordingly, the position of the third pixel contact hole 11633 through which the third pixel electrode 213 passes inside the planarization layer 117 may not be limited by a region of the third pixel connection metal 11753.

The third pixel connection metal 11753 is disposed on the interlayer-insulating layer 115. Various conductive layers besides the third pixel connection metal 11753 are disposed on the interlayer-insulating layer 115. Accordingly, the position of the third pixel connection metal 11753 is limited inside the third region PX3, and when the third pixel electrode 213 directly contacts the third pixel connection metal 11753, the position of the third pixel contact hole 11633 is also limited.

In contrast, in the organic light-emitting display apparatus according to the present embodiment, the third pixel electrode 213 is electrically connected to the third pixel connection metal 11753 through the third pixel bridge electrode 1183. Accordingly, the position of the third pixel contact hole 11633 through which the third pixel electrode 213 passes inside the planarization layer 117 may not be limited by a region of the third pixel connection metal 11753. Accordingly, when viewed in a direction perpendicular to the substrate 101 (i.e., plan view), the third pixel contact hole 11633 may be defined outside the third pixel protective contact hole. Furthermore, as shown in FIG. 6, when viewed in a direction perpendicular to the substrate 101 (i.e., plan view), the third pixel contact hole 11633 may be defined outside the third pixel connection metal 11753.

For reference, the pixel-defining layer 119 covers the edges of the third pixel electrode 213 and also covers a portion of the third pixel electrode 213 that corresponds to the third pixel contact hole 11633. In the organic light-emitting display apparatus according to the present embodiment, the position of the third pixel contact hole 11633 through which the third pixel electrode 213 passes inside the planarization layer 117 is not limited by a region of the third pixel connection metal 11753. Accordingly, the position of the third pixel contact hole 11633 may be easily changed. As a result, since the size of the opening of the pixel-defining layer 119 that exposes the third pixel electrode 213 may be easily widened when needed, an aperture ratio may be increased.

In addition, as shown in FIG. 6, the third pixel contact hole 11633 may not be defined in the third region PX3 but may be disposed in the first region PX1 like the second pixel contact hole 11632. Accordingly, the area of the third pixel electrode 213 in the third region PX3 may be remarkably widened. In this case, the area of the third pixel electrode 213 may be greater than the area of the first pixel electrode 211. In addition, the area of the third pixel electrode 213 may be greater than the area of the second pixel electrode 212, the second pixel electrode 212 having the area greater than the area of the first pixel electrode 211. As an example, when a light-emitting efficiency of a third emission layer on the third pixel electrode 213 in the third region PX3 is less than a light-emitting efficiency of the first emission layer on the first pixel electrode 211 in the first region PX1 and a light-emitting efficiency of the second emission layer on the second pixel electrode 212 in the second region PX2, it is required that the area of the third emission layer is greater than the area of the first emission layer and the area of the second emission layer when viewed in a direction perpendicular to the substrate 101 (i.e., plan view).

In the organic light-emitting display apparatus according to the present embodiment, since the area of the third pixel electrode 213 may be greater than the area of the first pixel electrode 211 and the area of the second pixel electrode 212, the area of the third emission layer may be greater than the area of the first emission layer and the area of the second emission layer. The third emission layer may include an emission layer that emits, for example, light in a blue wavelength, and the first emission layer may include an emission layer that emits, for example, light in a red wavelength. In this case, the second emission layer on the second pixel electrode 212 may include an emission layer that emits, for example, light in a green wavelength.

Figure 7:
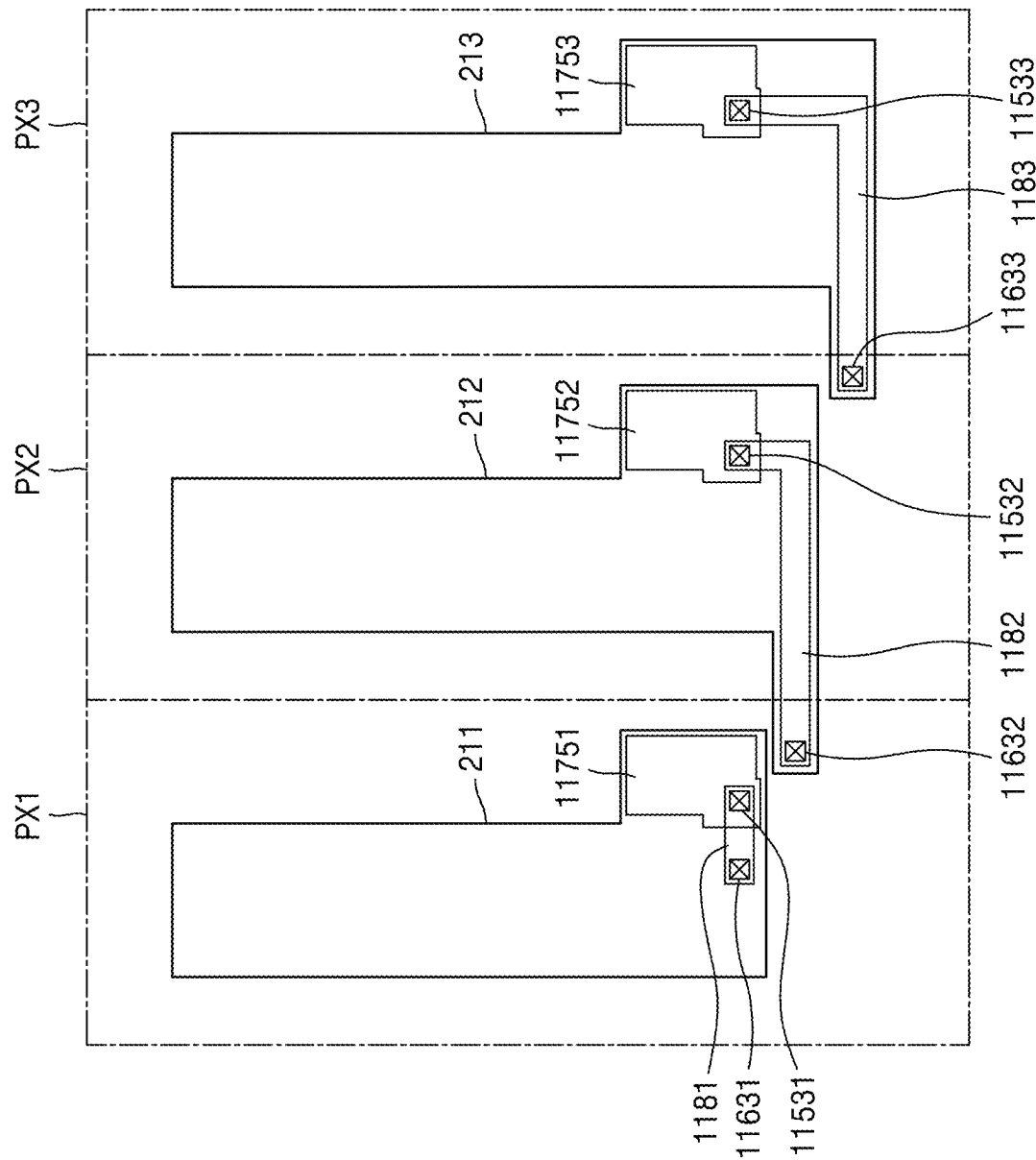
FIG. 7 is a layout view of some elements of pixels of a display apparatus according to another embodiment.

Though it is shown in FIG. 6 that, like the second pixel contact hole 11632, the third pixel contact hole 11633 is defined in the first region PX1, the embodiment according to the invention is not limited thereto. As an example, as shown in FIG. 7, which is a layout view of some elements of pixels of a display apparatus according to another embodiment, the second pixel contact hole 11632 may be defined in the first region PX1 and the third pixel contact hole 11633 may be defined in the second region PX2. Even in this case, the area of the third pixel electrode 213 may be greater than the area of the second pixel electrode 212 having the area greater than the area of the first pixel electrode 211.

Figure 8:
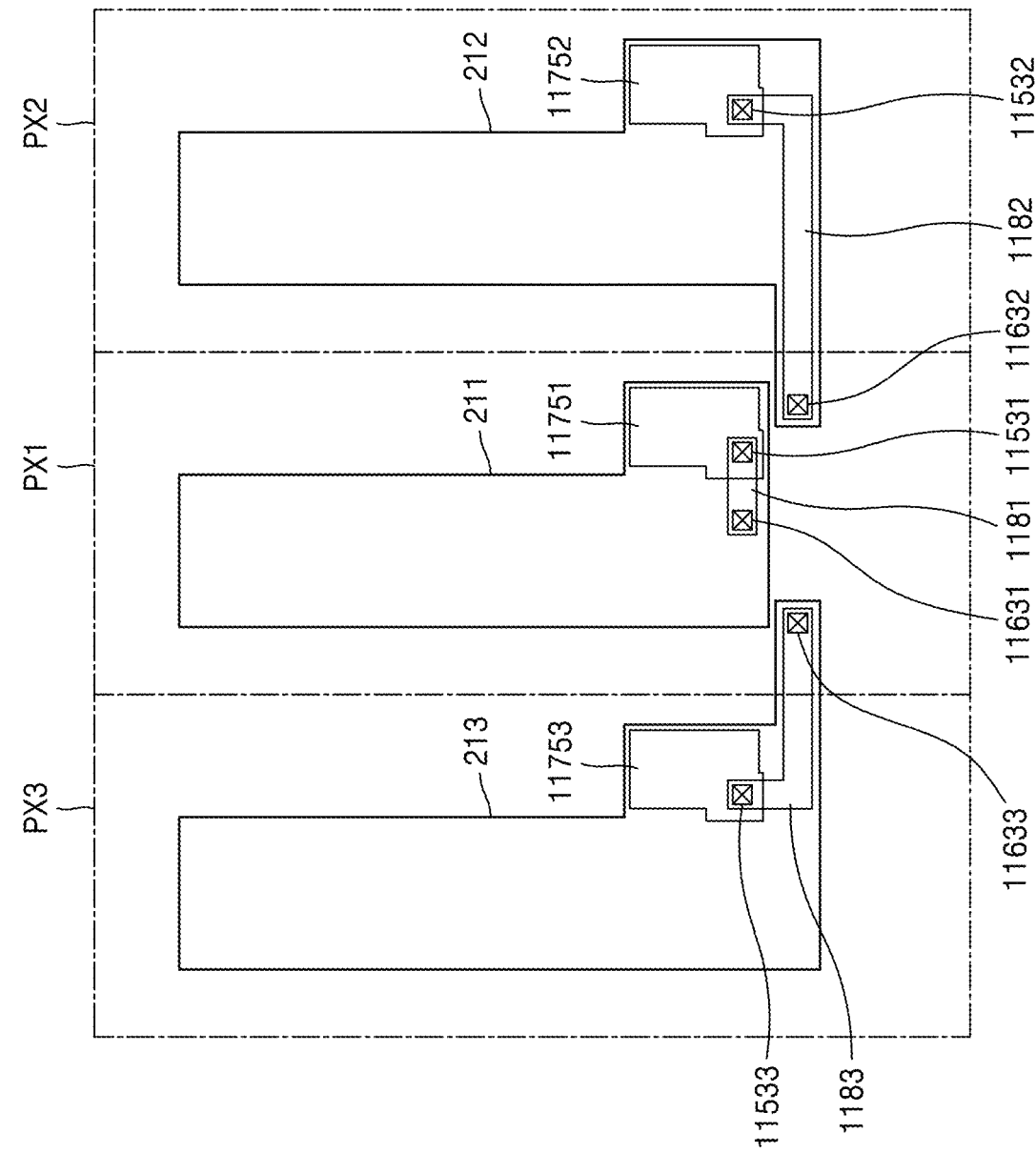
FIG. 8 is a layout view of some elements of pixels of a display apparatus according to another embodiment.

As shown in FIG. 8, which is a layout view of some elements of pixels of a display apparatus according to another embodiment, the second region PX2 may be disposed on one side of the first region PX1, and the third region PX3 may be disposed on another side of the first region PX1. Even in this case, the second pixel contact hole 11632 may be defined in the first region PX1 and the third pixel contact hole 11633 may be defined also in the first region PX1. Through this configuration, aperture ratios of the second region PX2 and the third region PX3 may be increased compared to an aperture ratio of the first region PX1.

Figure 9:
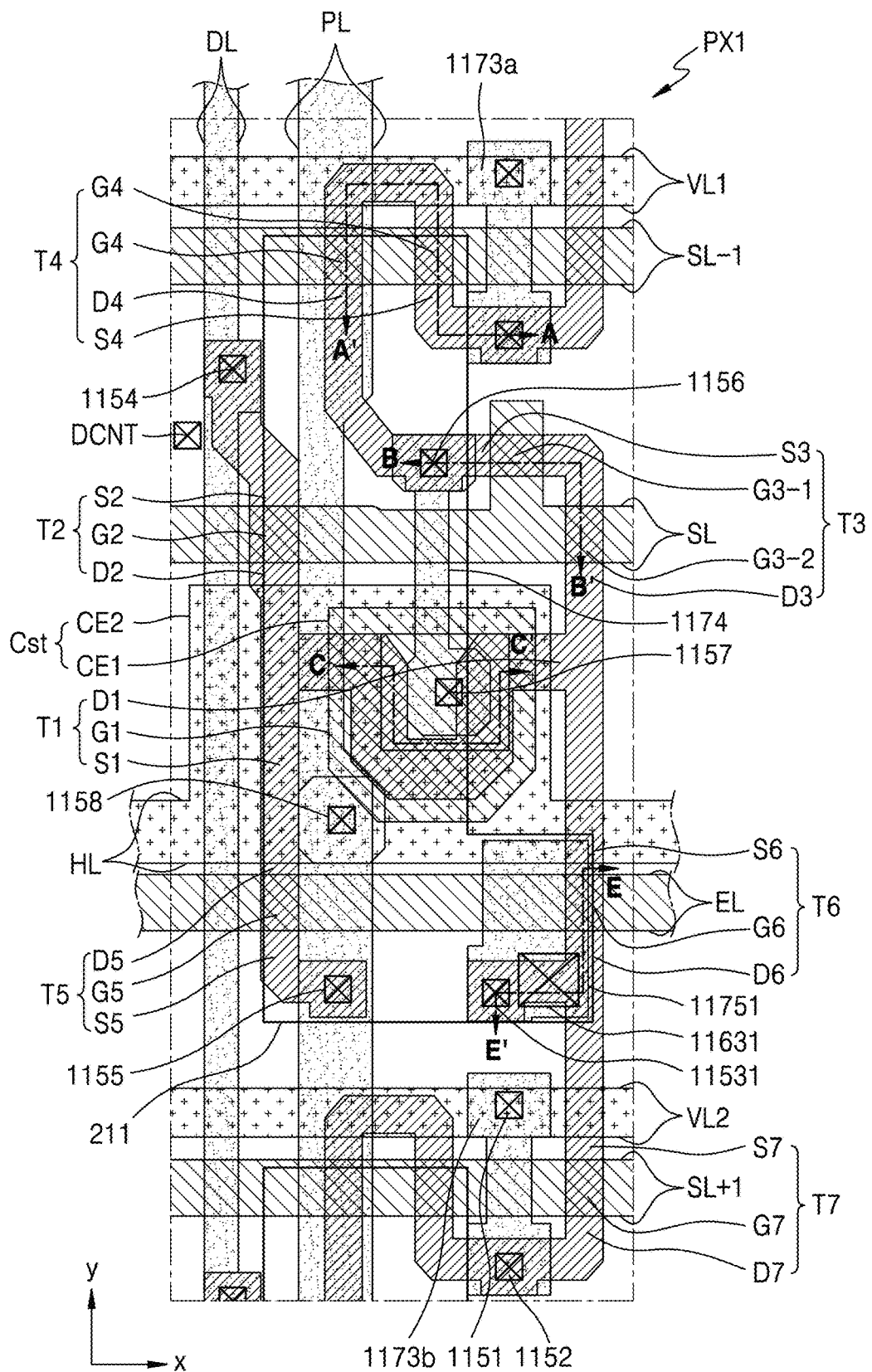
FIG. 9 is a layout view of positions of thin-film transistors and a capacitor in a pixel of a display apparatus according to another embodiment.
Figure 10:
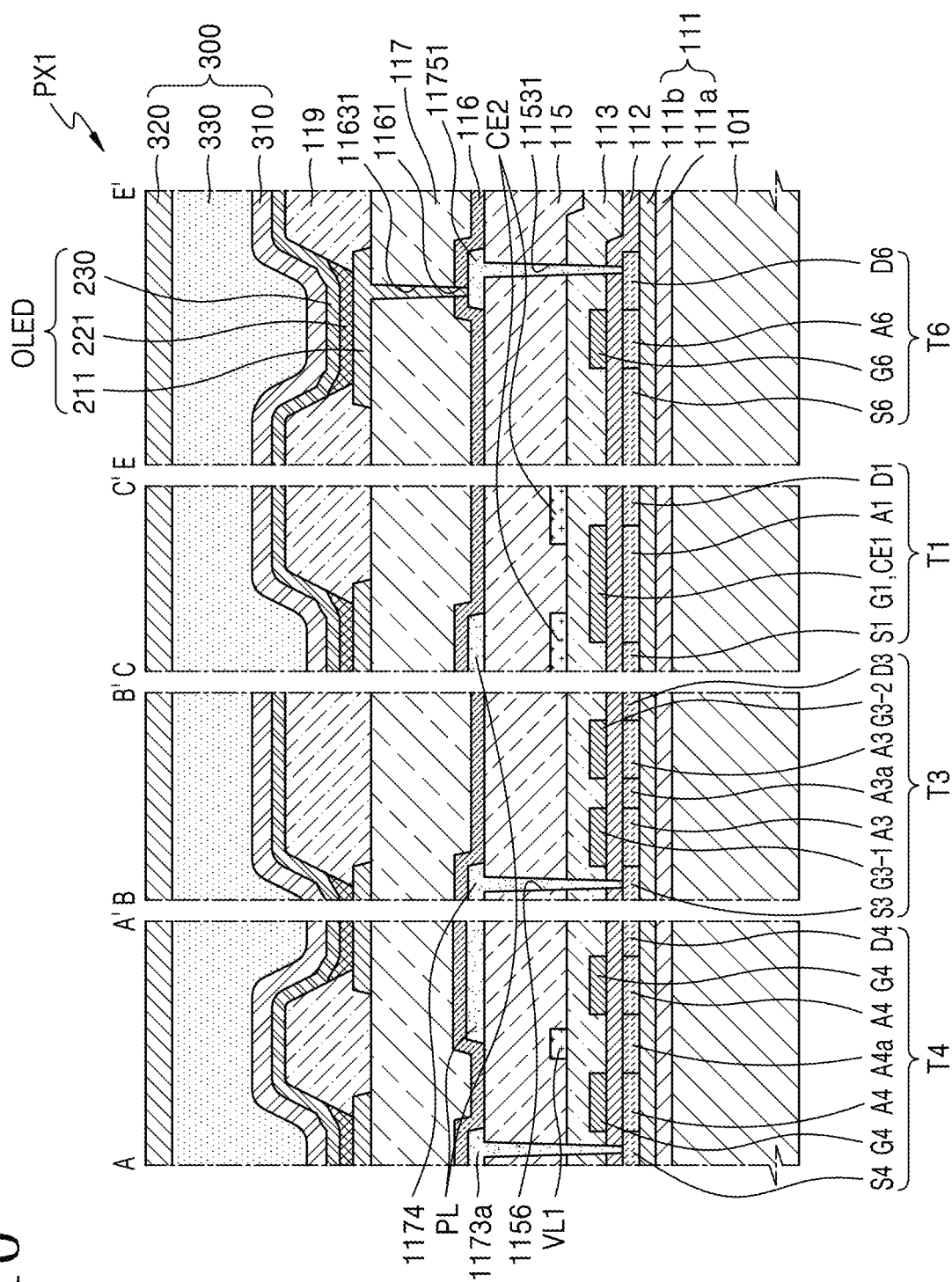
FIG. 10 is a cross-sectional view of portions of FIG. 9.

FIG. 9 is a layout view of positions of thin film transistors and a capacitor in a pixel of a display apparatus according to another embodiment, and FIG. 10 is a cross-sectional view of portions of FIG. 9. Specifically, FIG. 9 is a layout view of positions of various elements in the first region PX1 of an organic light-emitting display apparatus according to another embodiment. FIG. 10 is a cross-sectional view of portions of FIG. 9, showing the display apparatus 1, taken along lines A-A', B-B', C-C', and E-E' of FIG. 9. Among elements of an organic light-emitting display apparatus according to the present embodiment, elements that are the same as/similar to the elements of an organic light-emitting display apparatus according to the above embodiment are not described, for convenience.

The organic light-emitting display apparatus according to the present embodiment is different from the organic light-emitting display apparatus according to the embodiment described with reference to FIG. 3, etc. in that there is no first pixel bridge electrode 1181 in the first region PX1. In the organic light-emitting display apparatus according to the present embodiment, the first pixel electrode 211 is directly connected to the first pixel connection metal 11751. That is, the first pixel electrode 211 on the planarization layer 117 is directly connected to the first pixel connection metal 11751 through the first pixel contact hole 11631 of the planarization layer 117 and the first pixel protective contact hole 1161 of the protective insulating layer 116.

Unlike this, the second pixel electrode 212 on the planarization layer 117 in the second region PX2 is connected to the second pixel bridge electrode 1182 and electrically connected to the second pixel connection metal 11752 through the second pixel bridge electrode 1182. That is, the second pixel bridge electrode 1182 is disposed on the protective insulating layer 116 covering the second pixel connection metal 11752 and contacts the second pixel connection metal 11752 through the second pixel protective contact hole of the protective insulating layer 116. The second pixel electrode 212 on the planarization layer 117 covering the second pixel bridge electrode 1182 is connected to the second pixel bridge electrode 1182 through the second pixel contact hole 11632 of the planarization layer 117. In this case, when viewed in a direction perpendicular to the substrate 101 (i.e., plan view), the second pixel contact hole 11632 is defined outside the second pixel protective contact hole. Specifically, when viewed in a direction perpendicular to the substrate 101 (i.e., plan view), the second pixel contact hole 11632 may be defined outside the second pixel connection metal 11752.

In the organic light-emitting display apparatus according to the present embodiment, the second pixel electrode 212 does not directly contact the second pixel connection metal 11752 but is electrically connected to the second pixel connection metal 11752 through the second pixel bridge electrode 1182. Accordingly, the position of the second pixel contact hole 11632 through which the second pixel electrode 212 passes inside the planarization layer 117 may not be limited by a region of the second pixel connection metal 11752. In this case, when viewed in a direction perpendicular to the substrate 101 (i.e., plan view), the second pixel contact hole 11632 may be defined outside the second pixel protective contact hole. Furthermore, as shown in FIG. 11, when viewed in a direction perpendicular to the substrate 101 (i.e., plan view), the second pixel contact hole 11632 may be defined outside the second pixel connection metal 11752.

As described above, the pixel-defining layer 119 covers the edges of the second pixel electrode 212 and also covers a portion of the second pixel electrode 212 that corresponds to the second pixel contact hole 11632. In the organic light-emitting display apparatus according to the present embodiment, the position of the second pixel contact hole 11632 may be easily changed. As a result, since the size of the opening of the pixel-defining layer 119 that exposes the second pixel electrode 212 may be easily widened when needed, an aperture ratio may be increased.

Figure 11:
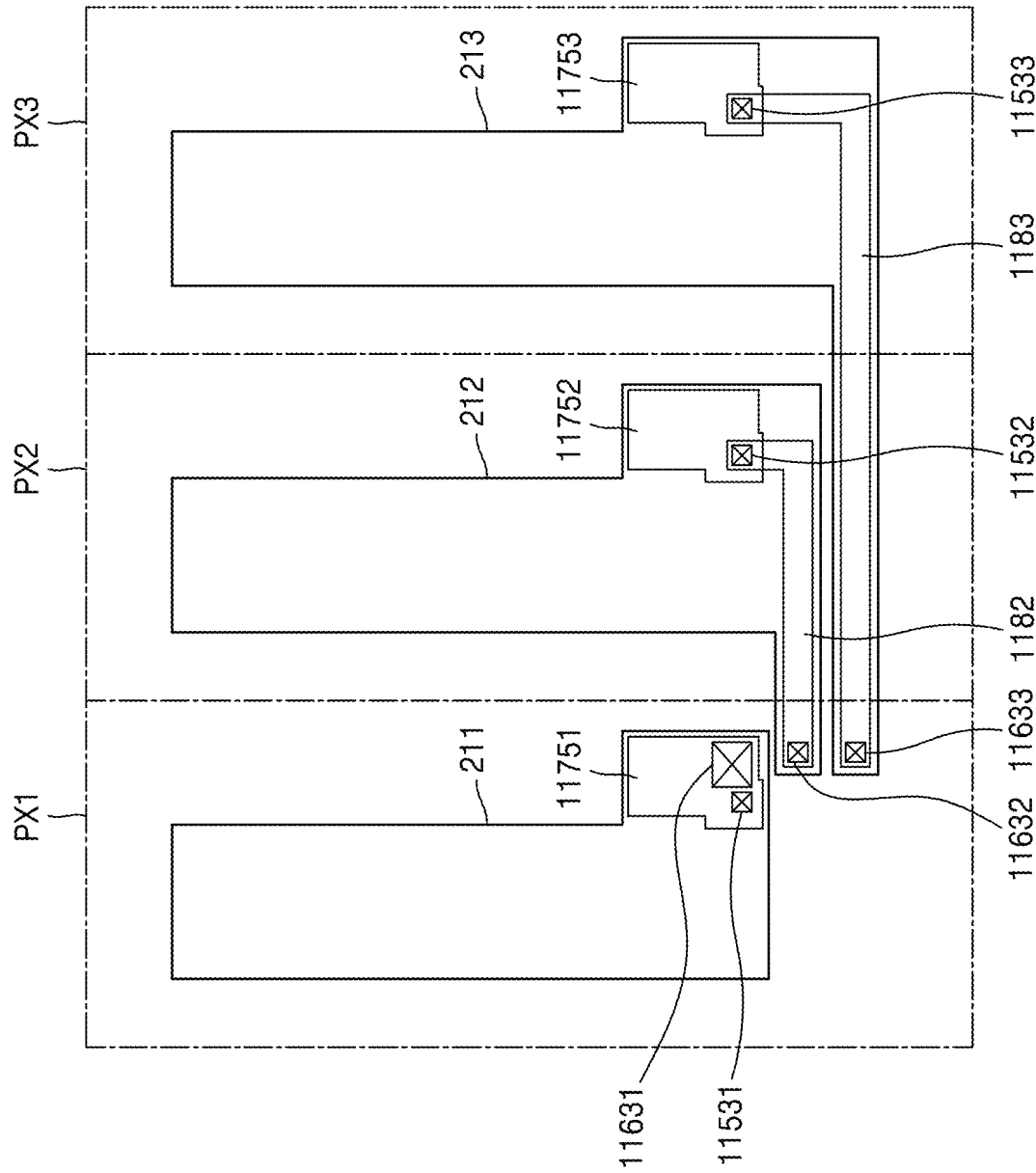
FIG. 11 is a layout view of some elements of a plurality of pixels including the pixel of FIG. 9.

In addition, as shown in FIG. 11, the second pixel contact hole 11632 may be defined in the first region PX1, not the second region PX2. Accordingly, the area of the second pixel electrode 212 in the second region PX2 may be remarkably widened. In this case, the area of the second pixel electrode 212 may be greater than the area of the first pixel electrode 211. As an example, when a light-emitting efficiency of the second emission layer on the second pixel electrode 212 in the second region PX2 is less than a light-emitting efficiency of the first emission layer on the first pixel electrode 211 in the first region PX1, it is required that the area of the second emission layer is greater than the area of the first emission layer when viewed in a direction perpendicular to the substrate 101 (i.e., plan view). In the organic light-emitting display apparatus according to the present embodiment, since the area of the second pixel electrode 212 may be greater than the area of the first pixel electrode 211, the area of the second emission layer may be greater than the area of the first emission layer. The third emission layer may include an emission layer that emits, for example, light in a green wavelength, and the first emission layer may include an emission layer that emits, for example, light in a red wavelength.

FIG. 11 shows the third region PX3 in addition to the first region PX1 and the second region PX2. The first to third pixels PX1, PX2, and PX3 may be sequentially disposed. The third region PX3 shown in FIG. 11 may have the same structure as the first region PX1 of the organic light-emitting display apparatus according to the above embodiment described with reference to FIGS. 3 to 5.

Elements having a similar structure to that in the first region PX1 may be disposed also in the third region PX3 of the substrate 101. As an example, the third pixel semiconductor layer is disposed over the substrate 101 and includes a third pixel drain region in the third region PX3. The third pixel semiconductor layer may have the same structure as the first pixel semiconductor layer having the first pixel drain region D6 in the first region PX1 shown in FIG. 10.

The third pixel connection metal 11753 is disposed on the interlayer-insulating layer 115 covering the third pixel semiconductor layer and contacts the third pixel drain region through the third pixel interlayer contact hole 11533 of the interlayer-insulating layer 115. The third pixel bridge electrode 1183 is disposed on the protective insulating layer 116 covering the third pixel connection metal 11753 and contacts the third pixel connection metal 11753 through the third pixel protective contact hole of the protective insulating layer 116.

The third pixel electrode 213 is disposed on the planarization layer 117 covering the third pixel bridge electrode 1183 and is connected to the third pixel bridge electrode 1183 through the third pixel contact hole 11633 of the planarization layer 117. In this case, when viewed in a direction perpendicular to the substrate 101 (i.e., plan view), the third pixel contact hole 11633 is defined outside the third pixel protective contact hole. Specifically, when viewed in a direction perpendicular to the substrate 101 (i.e., plan view), the third pixel contact hole 11633 may be defined outside the third pixel connection metal 11753.

In the organic light-emitting display apparatus according to the present embodiment, the third pixel electrode 213 does not directly contact the third pixel connection metal 11753 but is electrically connected to the third pixel connection metal 11753 through the third pixel bridge electrode 1183. Accordingly, the position of the third pixel contact hole 11633 through which the third pixel electrode 213 passes inside the planarization layer 117 may not be limited by a region of the third pixel connection metal 11753. In this case, when viewed in a direction perpendicular to the substrate 101 (i.e., plan view), the third pixel contact hole 11633 may be defined outside the third pixel protective contact hole. Furthermore, as shown in FIG. 11, when viewed in a direction perpendicular to the substrate 101 (i.e., plan view), the third pixel contact hole 11633 may be defined outside the third pixel connection metal 11753.

For reference, the pixel-defining layer 119 covers the edges of the third pixel electrode 213 and also covers a portion of the third pixel electrode 213 that corresponds to the third pixel contact hole 11633. In the organic light-emitting display apparatus according to the present embodiment, the position of the third pixel contact hole 11633 through which the third pixel electrode 213 passes inside the planarization layer 117 is not limited by a region of the third pixel connection metal 11753. Accordingly, the position of the third pixel contact hole 11633 may be easily changed. As a result, since the size of the opening of the pixel-defining layer 119 that exposes the third pixel electrode 213 may be easily widened when needed, an aperture ratio may be increased.

In addition, as shown in FIG. 11, like the second pixel contact hole 11632, the third pixel contact hole 11633 may be defined in the first region PX1, not the third region PX2. Accordingly, the area of the third pixel electrode 213 in the third region PX3 may be remarkably widened. In this case, the area of the third pixel electrode 213 may be greater than the area of the first pixel electrode 211. In addition, the area of the third pixel electrode 213 may be greater than the area of the second pixel electrode 212, the second pixel electrode 212 having the area greater than the area of the first pixel electrode 211. Accordingly, the area of the third emission layer on the third pixel electrode 213 may be greater than the area of the first emission layer on the first pixel electrode 211 and the area of the second emission layer on the second pixel electrode 212. The third emission layer may include an emission layer that emits, for example, light in a blue wavelength, and the first emission layer may include an emission layer that emits, for example, light in a red wavelength. In this case, the second emission layer on the second pixel electrode 212 may include an emission layer that emits, for example, light in a green wavelength.

Figure 12:
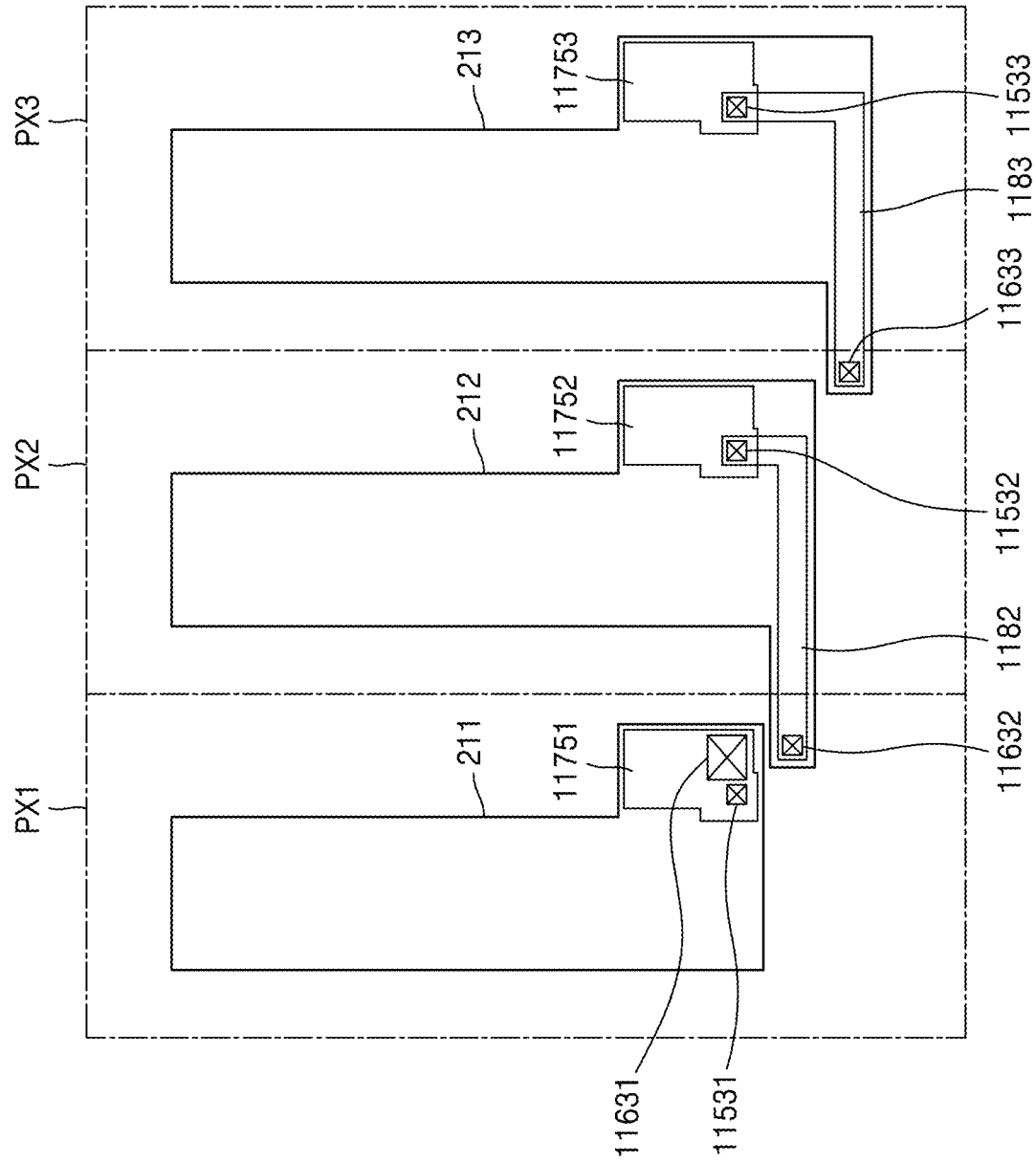
FIG. 12 is a layout view of some elements of pixels of a display apparatus according to another embodiment.

Though it is shown in FIG. 11 that, like the second pixel contact hole 11632, the third pixel contact hole 11633 is defined in the first region PX1, the embodiment according to the invention is not limited thereto. As an example, as shown in FIG. 12, which is a layout view of some elements of pixels of a display apparatus according to another embodiment, the second pixel contact hole 11632 may be defined in the first region PX1 and the third pixel contact hole 11633 may be defined in the second region PX2. Even in this case, the area of the third pixel electrode 213 may be greater than the area of the second pixel electrode 212 having the area greater than the area of the first pixel electrode 211.

Figure 13:
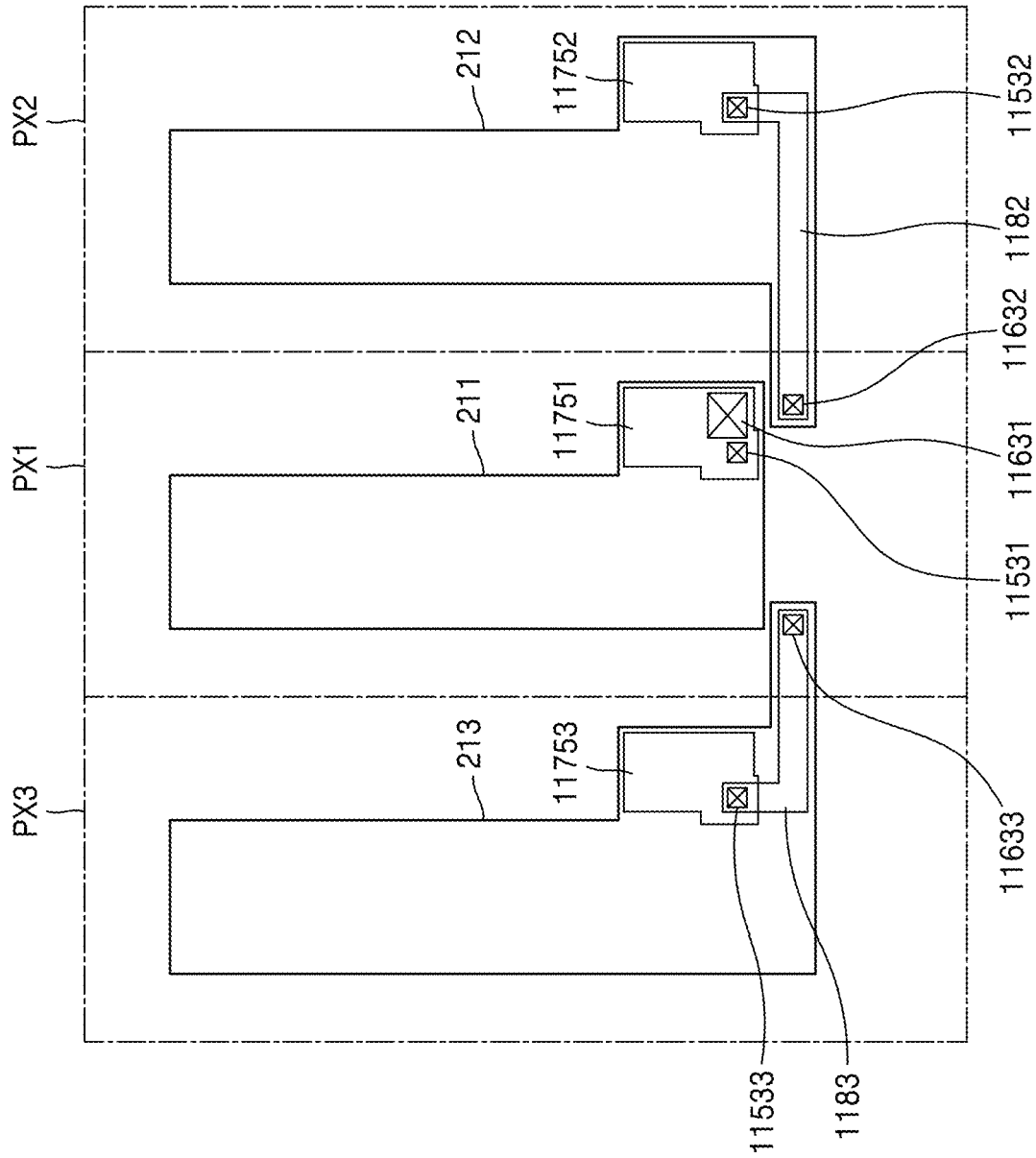
FIG. 13 is a layout view of some elements of pixels of a display apparatus according to another embodiment.

As shown in FIG. 13, which is a layout view of some elements of pixels of a display apparatus according to another embodiment, the second region PX2 may be disposed on one side of the first region PX1, and the third region PX3 may be disposed on another side of the first region PX1. Even in this case, the second pixel contact hole 11632 may be defined in the first region PX1, and the third pixel contact hole 11633 may be defined also in the first region PX1. Through this configuration, aperture ratios of the second region PX2 and the third region PX3 may be increased compared to an aperture ratio of the first region PX1.

According to an embodiment, an organic light-emitting display apparatus in which a sufficient aperture ratio may be secured may be implemented. However, the scope of the present disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An organic light-emitting display apparatus comprising:
a substrate including a first region and a second region;
a first pixel semiconductor layer disposed on the substrate and including a first pixel drain region in the first region;
a second pixel semiconductor layer disposed on the substrate and including a second pixel drain region in the second region;
an interlayer-insulating layer covering the first pixel semiconductor layer and the second pixel semiconductor layer;
a first pixel connection metal disposed on the interlayer-insulating layer and contacting the first pixel drain region through a first pixel interlayer contact hole defined in the interlayer-insulating layer in the first region;
a second pixel connection metal disposed on the interlayer-insulating layer and contacting the second pixel drain region through a second pixel interlayer contact hole defined in the interlayer-insulating layer in the second region;
a protective insulating layer covering the first pixel connection metal and the second pixel connection metal;
a first pixel bridge electrode disposed on the protective insulating layer and contacting the first pixel connection metal through a first pixel protective contact hole defined in the protective insulating layer in the first region;
a second pixel bridge electrode disposed on the protective insulating layer and contacting the second pixel connection metal through a second pixel protective contact hole defined in the protective insulating layer in the second region, the second pixel bridge electrode including a first part, of the second pixel bridge electrode, protruding from the second region into the first region;
a planarization layer covering the first pixel bridge electrode and the second pixel bridge electrode;
a first pixel electrode disposed on the planarization layer and connected to the first pixel bridge electrode through a first pixel contact hole defined in the planarization layer in the first region; and
a second pixel electrode disposed on the planarization layer and consisting of a first part, of the second pixel electrode, an entirety of which is disposed in the second region and a second part protruding from the second region into the first region, the second part of the second pixel electrode being connected to the first part of the second pixel bridge electrode through a second pixel contact hole defined in the planarization layer in the first region,
wherein an entirety of the second region is located outside the first region, and the first region and the second region are adjacent to each other by one side thereof and have a same shape,
wherein the second pixel electrode covers an entirety of the second pixel bridge electrode and an entirety of the second pixel connection metal in a plan view.

2. The organic light-emitting display apparatus of claim 1, wherein, when viewed in the direction perpendicular to the substrate, the first pixel contact hole is defined outside the first pixel connection metal.

3. The organic light-emitting display apparatus of claim 1, wherein the protective insulating layer includes an inorganic material.

4. The organic light-emitting display apparatus of claim 1, wherein, when viewed in the direction perpendicular to the substrate, the second pixel contact hole is defined outside the second pixel connection metal.

5. The organic light-emitting display apparatus of claim 1, wherein an area of the second pixel electrode is greater than an area of the first pixel electrode.

6. The organic light-emitting display apparatus of claim 1, wherein the substrate includes a third region, and
the organic light-emitting display apparatus further includes:
a third pixel semiconductor layer disposed on the substrate and including a third pixel drain region in the third region;
a third pixel connection metal disposed on the interlayer-insulating layer and contacting the third pixel drain region through a third pixel interlayer contact hole defined in the interlayer-insulating layer in the third region, the interlayer-insulating layer covering the third pixel semiconductor layer;
a third pixel bridge electrode disposed on the protective insulating layer and contacting the third pixel connection metal through a third pixel protective contact hole defined in the protective insulating layer in the third region, the third pixel bridge electrode including a third part protruding from the third region into the first region or the second region, the protective insulating layer covering the third pixel connection metal; and
a third pixel electrode disposed on the planarization layer and including a fourth part protruding from the third region into the first region or the second region, the fourth part of the third pixel electrode being connected to the third part of the third pixel bridge electrode through a third pixel contact hole defined in the planarization layer in the first region or the second region, the planarization layer covering the third pixel bridge electrode.

7. The organic light-emitting display apparatus of claim 6, wherein, when viewed in the direction perpendicular to the substrate, the third pixel contact hole is defined outside the third pixel connection metal.

8. The organic light-emitting display apparatus of claim 6, wherein the third pixel contact hole is defined in the first region.

9. The organic light-emitting display apparatus of claim 6, wherein the third pixel contact hole is defined in the second region.

10. The organic light-emitting display apparatus of claim 8, wherein an area of the second pixel electrode is greater than an area of the first pixel electrode, and an area of the third pixel electrode is greater than the area of the second pixel electrode.

11. An organic light-emitting display apparatus comprising:
a substrate including a first region and a second region;
a first pixel semiconductor layer disposed on the substrate and including a first pixel drain region in the first region;
a second pixel semiconductor layer disposed on the substrate and including a second pixel drain region in the second region;
an interlayer-insulating layer covering the first pixel semiconductor layer and the second pixel semiconductor layer;
a first pixel connection metal disposed on the interlayer-insulating layer and contacting the first pixel drain region through a first pixel interlayer contact hole defined in the interlayer-insulating layer in the first region;
a second pixel connection metal disposed on the interlayer-insulating layer and contacting the second pixel drain region through a second pixel interlayer contact hole defined in the interlayer-insulating layer in the second region;
a protective insulating layer covering the first pixel connection metal and the second pixel connection metal;
a second pixel bridge electrode disposed on the protective insulating layer and contacting the second pixel connection metal through a second pixel protective contact hole defined in the protective insulating layer in the second region, the second pixel bridge electrode including a first part, of the second pixel bridge electrode, protruding from the second region into the first region;
a planarization layer covering the second pixel bridge electrode;
a first pixel electrode disposed on the planarization layer and contacting the first pixel connection metal through a first pixel contact hole defined in the planarization layer in the first region and a first pixel protective contact hole defined in the protective insulating layer in the first region; and
a second pixel electrode disposed on the planarization layer and consisting of a first part, of the second pixel electrode, an entirety of which is disposed in the second region and a second part protruding from the second region into the first region, the second part of the second pixel electrode contacting the first part of the second pixel bridge electrode through a second pixel contact hole defined in the planarization layer in the first region,
wherein an entirety of the second region is located outside the first region, and the first region and the second region are adjacent to each other by one side thereof and have a same shape,
wherein the second pixel electrode covers an entirety of the second pixel bridge electrode and an entirety of the second pixel connection metal in a plan view.

12. The organic light-emitting display apparatus of claim 11, wherein an area of the second pixel electrode is greater than an area of the first pixel electrode.

13. The organic light-emitting display apparatus of claim 11, wherein the substrate includes a third region, and
the organic light-emitting display apparatus further includes:
a third pixel semiconductor layer disposed on the substrate and including a third pixel drain region in the third region;
a third pixel connection metal disposed on the interlayer-insulating layer and contacting the third pixel drain region through a third pixel interlayer contact hole defined in the interlayer-insulating layer in the third region, the interlayer-insulating layer covering the third pixel semiconductor layer;
a third pixel bridge electrode disposed on the protective insulating layer and contacting the third pixel connection metal through a third pixel protective contact hole defined in the protective insulating layer in the third region, the third pixel bridge electrode including a third part protruding from the third region into the first region or the second region, the protective insulating layer covering the third pixel connection metal; and a third pixel electrode disposed on the planarization layer and including a fourth part protruding from the third region into the first region or the second region, the fourth part of the third pixel electrode being connected to the third part of the third pixel bridge electrode through a third pixel contact hole defined in the planarization layer in the first region or the second region, the planarization layer covering the third pixel bridge electrode.

14. The organic light-emitting display apparatus of claim 13, wherein, when viewed in a direction perpendicular to the substrate, the third pixel contact hole is defined outside the third pixel connection metal.

15. The organic light-emitting display apparatus of claim 13, wherein the third pixel contact hole is defined in the first region.

16. The organic light-emitting display apparatus of claim 13, wherein the third pixel contact hole is defined in the second region.

17. The organic light-emitting display apparatus of claim 15, wherein an area of the second pixel electrode is greater than an area of the first pixel electrode, and an area of the third pixel electrode is greater than the area of the second pixel electrode.

* * * * *